(12) United States Patent
Slessman et al.

(10) Patent No.: US 9,709,965 B2
(45) Date of Patent: Jul. 18, 2017

(54) DATA CENTER INTELLIGENT CONTROL AND OPTIMIZATION

(71) Applicant: BASELAYER TECHNOLOGY, LLC, Chandler, AZ (US)

(72) Inventors: George Slessman, Phoenix, AZ (US); William Slessman, Paradise Valley, AZ (US); Kevin Malik, Scottsdale, AZ (US)

(73) Assignee: BASELAYER TECHNOLOGY, LLC, Chandler, AZ (US)

( * ) Notice: Subject to any disclaimer, the term of this patent is extended or adjusted under 35 U.S.C. 154(b) by 296 days.

(21) Appl. No.: 13/788,834

(22) Filed: Mar. 7, 2013

(65) Prior Publication Data

US 2013/0190899 A1  Jul. 25, 2013

Related U.S. Application Data

(63) Continuation-in-part of application No. 12/626,299, filed on Nov. 25, 2009, now Pat. No. 8,783,336.
(Continued)

(51) Int. Cl.
| | |
|---|---|
| *G06F 15/16* | (2006.01) |
| *G05B 13/02* | (2006.01) |
| *H05K 7/20* | (2006.01) |
| *G06F 1/20* | (2006.01) |
| *G06F 9/50* | (2006.01) |
| *G06Q 10/04* | (2012.01) |
| *H05K 7/14* | (2006.01) |
| *G06F 1/32* | (2006.01) |

(52) U.S. Cl.
CPC .............. *G05B 13/02* (2013.01); *G06F 1/206* (2013.01); *G06F 1/3203* (2013.01); *G06F 9/5094* (2013.01); *G06Q 10/04* (2013.01); *H05K 7/1488* (2013.01); *H05K 7/1498* (2013.01); *H05K 7/20745* (2013.01); *Y02B 60/142* (2013.01)

(58) Field of Classification Search
None
See application file for complete search history.

(56) References Cited

U.S. PATENT DOCUMENTS

| 6,112,237 A | 8/2000 | Donaldson et al. |
| 7,620,613 B1 | 11/2009 | Moore et al. |

(Continued)

FOREIGN PATENT DOCUMENTS

WO  2012024692 A2  2/2012

OTHER PUBLICATIONS

IBM, Use of Virtualization for Power/Temperature Optimization in Large Data Centers, Aug. 30, 2007, IP.com, IPCOM000157645D, pp. 1-3.*

(Continued)

*Primary Examiner* — Jeffrey R Swearingen
(74) *Attorney, Agent, or Firm* — Lorenz & Kopf, LLP.

(57) ABSTRACT

Systems and methods of monitoring, analyzing, optimizing and controlling data centers and data center operations are disclosed. The system includes data collection and storage hardware and software for harvesting operational data from data center assets and operations. Intelligent analysis and optimization software enables identification of optimization and/or control actions. Control software and hardware enables enacting a change in the operational state of data centers.

23 Claims, 8 Drawing Sheets

Related U.S. Application Data

(60) Provisional application No. 61/119,980, filed on Dec. 4, 2008.

(56) References Cited

U.S. PATENT DOCUMENTS

| | | | |
|---|---|---|---|
| 8,223,025 B2 | 7/2012 | Stiver et al. | |
| 8,250,198 B2 * | 8/2012 | Zhang | G06Q 10/06 709/223 |
| 8,346,398 B2 | 1/2013 | Ahmed et al. | |
| 2002/0016639 A1 | 2/2002 | Smith et al. | |
| 2006/0031934 A1 * | 2/2006 | Kriegel | 726/22 |
| 2006/0260338 A1 | 11/2006 | VanGilder et al. | |
| 2007/0245011 A1 * | 10/2007 | Kouhsari et al. | 709/223 |
| 2007/0283005 A1 * | 12/2007 | Beliles et al. | 709/224 |
| 2009/0018673 A1 | 1/2009 | Dushane et al. | |
| 2009/0113323 A1 * | 4/2009 | Zhao et al. | 715/764 |
| 2009/0164811 A1 | 6/2009 | Sharma et al. | |
| 2012/0310703 A1 | 12/2012 | Cavalcanti et al. | |

OTHER PUBLICATIONS

USPTO, Non-Final Office Action for U.S. Appl. No. 13/791,930, mailed Jul. 26, 2013.
USPTO, Final Office Action for U.S. Appl. No. 13/791,930, mailed Jan. 6, 2014.
USPTO, Non-Final Office Action for U.S. Appl. No. 13/791,930, mailed Jun. 5, 2014.
European Patent Office International Searching Authority, International Search Report and Written Opinion for International Application No. PCT/US2014/015976, mailed Jun. 27, 2014.
United States International Preliminary Examining Authority, International Preliminary Report on Patentability for International Application No. PCT/US14/15976, mailed Apr. 10, 2015.

* cited by examiner

DATA CENTER INTELLIGENT CONTROL AND OPTIMIZATION

RELATED APPLICATIONS

This application claims priority to U.S. patent application Ser. No. 12/626,299 filed Nov. 25, 2009 and entitled "Apparatus and Method of Environmental Condition Management for Electronic Equipment." The '299 application claims priority to U.S. Provisional Patent Application No. 61/119,980 filed Dec. 4, 2008 entitled, "Thermal Management Cabinet for Electronic Equipment." The '299 and the '980 applications are incorporated by reference in their entireties.

FIELD OF THE INVENTION

The present invention relates generally to data centers, and more particularly to monitoring, optimizing and controlling data center operations.

BACKGROUND

Data centers are typically facilities for housing electronic equipment. Traditionally, these facilities often have a large footprint due to the various components necessary for maintaining the facilities, including cooling equipment. Monitoring, optimizing and controlling a data center and/or data center infrastructure assets is typically performed manually without considering multiple aspects of the data center. For example, managing the data center infrastructure (e.g., cooling, power distribution, etc.) is typically done without considering the utilization of servers within the data center. Similarly, management of the servers (and application running on the servers) is typically ignorant of the underlying data center infrastructure.

SUMMARY OF THE INVENTION

Embodiments of this disclosure include systems and methods of optimizing data centers and data center operations by: collecting, monitoring, analyzing, warehousing and mining data; analyzing and predicting using proprietary algorithms, forecasts, simulations, and models to develop alternative data center configurations and processes; optimizing by analyzing a plurality of optimization dimensions and developing and evaluating alternative optimization actions; and generating and implementing optimization instructions.

In various embodiments, a data center control system, comprises a memory in communication with a processor, the processor when executing a computer program for data center control, performs operations to optimize data center operations. The system accesses input data associated with data center operations, wherein the input data comprises at least one of inventory data, operational data, historical data and external data. The system determines at least one data center optimization dimension. Optimization dimensions may include at least one of reliability, resiliency, risk, latency, efficiency, cost and threat avoidance.

Based upon at least a portion of the input data the system forecasts to produce predictive data. Based upon at least one data center optimization dimension, the predictive data and the input data, the system determines an optimization action. The system generates an optimization instruction based upon the optimization action. In various embodiments, executing the optimization instruction causes a change in an operational state associated with the data center operations.

Various embodiments of this disclosure include systems and methods of monitoring, analyzing and controlling data centers and related hardware and software. In an embodiment, a data center infrastructure control system ("DCICS") determines, based upon a first expression, a first operation and data collection points associated with data center assets. Data collection points may include sensors, indicators, detectors, application programming interfaces, system data, etc. In various embodiments, the expression may be obtained from a data base, a user interface, another system, a hardware device, etc. In various embodiments, the expression may be derived or generated by the DCICS based upon, for example, other expressions, data or events.

DCICS interprets and/or analyzes the expression and generates machine code instructions that may include, for example, instructions to obtain the first point data from the data collection points and to perform the operation based upon the first point data. In various embodiments, the instructions may include instructions for obtaining, receiving or retrieving the first point data.

DCICS executes the machine code instructions to produce a first result of the first operation. In various embodiments, in response to producing the first result, DCICS examines or analyzes the first result and determines a first control instruction. Executing the first control instruction causes a change in an operational state of at least one of a data center asset and a data center. In various embodiments, DCICS may execute the control instruction, partially execute the control instruction, and/or communicate the control instruction to a hardware device or software program for execution.

Other aspects and advantages of the present invention will become apparent from the following detailed description, taken in conjunction with the accompanying drawings, illustrating the principles of the invention by way of example only.

BRIEF DESCRIPTION OF THE DRAWINGS

The foregoing and other objects, features, and advantages of the present invention, as well as the invention itself, will be more fully understood from the following description of various embodiments, when read together with the accompanying drawings, in which.

DETAILED DESCRIPTION

Figure 1:
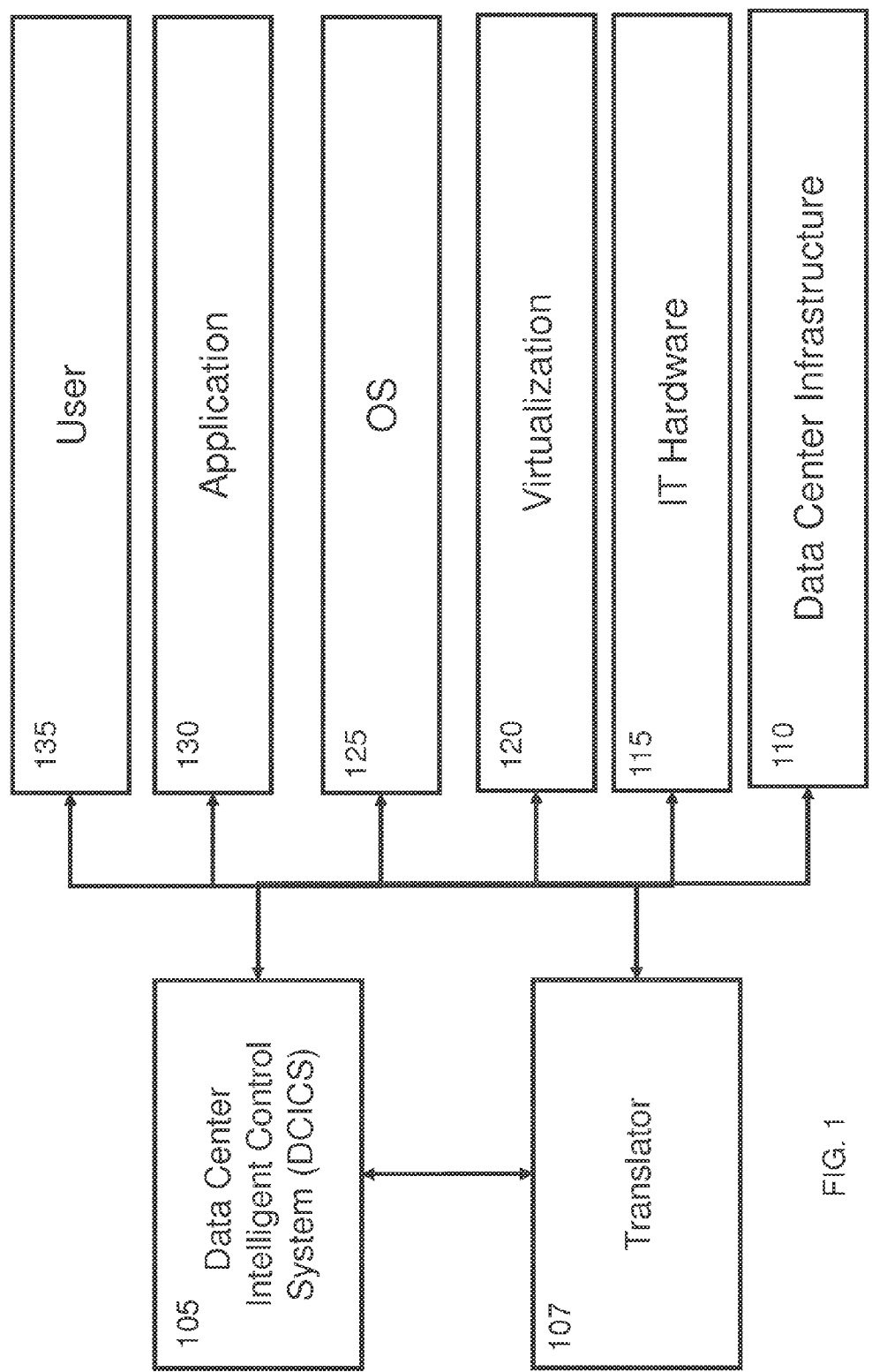
FIG. 1 depicts logical data center operations data sources leveraged by the technology, in accordance with various embodiments.

Described herein is technology for data center monitoring, optimization and control that leverages data from multiple components of the data center, data center related hardware and external data sources. For example, as described herein, a DCICS can communicate with multiple components of the data center and/or external data sources to collect data relating to and/or affecting the operation of the data center (data center operations data). The DCICS can modify the operation or operational state of the data center based on the collected data center operations data.

While the description references specific technologies, system architectures, operational control and data management techniques, practitioners will appreciate that this description is but various embodiments and that other devices and/or methods may be implemented without departing from the scope of the invention. While the embodiments described herein are described in sufficient detail to enable those skilled in the art to practice the invention, it should be understood that other embodiments may be realized and that logical and mechanical changes may be made without departing from the spirit and scope of the invention. Thus, the detailed description herein is presented for purposes of illustration only and not of limitation.

For the sake of brevity, conventional data networking, application development and other functional aspects of the systems (and components of the individual operating components of the systems) may not be described in detail herein. Furthermore, the connecting lines shown in the various figures are intended to represent functional relationships and/or physical couplings between the various elements. It should be noted that many alternative or additional functional relationships or physical connections may be present in various embodiments.

The benefits provided by this disclosure and technology include, for example, increased efficiency of data center operations, reduced risk, lower costs, increased hardware and power utilization, increased reliability, increased profitability, increased security, increased resiliency, etc. For example, by leveraging the collected data center operations data, data center monitoring can be improved, the data center can operate at a higher efficiency, and the amount and impact failures within the data center can be reduced.

The technology described herein can utilize a DCICS to collect data center operations data and/or control the operation of the data center. For example, the DCICS can communicate with and collect data from various components of the data center and systems or "layers" associated with an information technology ("IT") stack, including: data center infrastructure (e.g., utilities, environmental management equipment, power generation and distribution equipment, power backup equipment, data center modules, data center facilities, etc.); IT equipment in the data center (e.g., PCs, servers, storage devices, networking equipment, etc.); software executing on IT equipment in, or associated with, the data center (e.g., virtualization systems, operating systems, user applications, etc.); and/or users in communication with any of the above. In various embodiments, the technology can collect data from external data sources, such as sources for weather data, seismic data, political data, economic (e.g., energy price changes), financial and/or news data. DCICS can consolidate, aggregate, analyze, process, and/or distill the collected information for analysis, storage and/or presentation to data center operators.

In various embodiments, DCICS can analyze the collected data for its impact on data center operations and performance. For example, the collected data can be analyzed in approximately real time to assess current data center operations and/or forecast future data center operations, operational conditions, constraints, needs, costs, capabilities, preferred or optimal configurations, etc. DCICS can store and analyze collected information to determine why certain events associated with data center operations occurred and various DCICS can execute various decision and control engines to develop and evaluate alternative data center configurations and implement changes in the operational configuration or operational state of data centers.

FIG. 1 depicts logical data center data sources leveraged by the technology. In various embodiments, DCICS 105 can communicate with and enable transparency into all layers of the IT stack, including, for example, a user layer, a virtualization layer, an application layer, an operating system layer, an IT or hardware layer and a data center infrastructure layer. In the illustrated embodiment, DCICS 105 is bi-directionally connected (e.g., via a data connection) to translator 107, data center infrastructure 110, IT hardware 115, virtualization layer 120, operating system 125, application 130, and/or user 135. While each of the illustrated translator 107, data center infrastructure 110, IT hardware 115, virtualization layer 120, operating system 125, application 130, and user 135 are represented by a box in the logical diagram, it should be appreciated that each can represent multiple instances of data center infrastructure, IT hardware, virtualization layers, operating systems, applications, and/or user.

Data center infrastructure 110 can include, for example, utilities, environmental management equipment, power generation and distribution equipment, power backup equipment, data center modules, and data center facilities. DCICS 105 can collect data center operations data from data center modules within a modular data center. For example, DCICS 105 can collect data from one or more modular data centers and/or data center modules, as described in U.S. patent application Ser. No. 13/751,568 filed Jan. 28, 2013 and entitled "Modular Data Center," the content of which is hereby incorporated in its entirety. In various embodiments, DCICS 105 can collect data center operations data from traditional data centers, such as raised floor facilities. DCICS 105 can send instructions (e.g., via data communications, control signal, etc.) to data center infrastructure 110. For example, DCICS 105 can cause the cooling equipment within a data center (or data center module) to increase/lower the temperature, humidity, etc. in the data center (or data center module).

In various embodiments, DCICS 105 may communicate with hardware elements (e.g., data center infrastructure 110, hardware 115, etc.) via translator 107. Translator 107 may be implemented as special purpose hardware, software or a combination of hardware and software elements. In various embodiments translator 107 enables 150+ vendor protocol languages, such as BACNet, Modbus, and Ethernet/IP, over a variety of media types, such as Ethernet and RS-232/485, to communicate with DCICS 105. Translator 107 is specially configured, custom designed and built hardware that "speaks" vendor protocol languages and then "translates" them into one language (e.g., OPC) that is "understood" by DCICS 105.

The translation capability of translator 107 enables enterprise-wide collection, storage, and display functions for a wide variety of data center infrastructure equipment, including building management, power distribution, and IT systems. Communications management is centralized and simplified into a single platform accessible by DCICS 105. In various embodiments, translator 107 can easily be expanded through plug-and-play device drivers, client interfaces, and hardware units. In various hardware embodiments of the translator, there is abundant room inside the translator enclosure for adding or removing snap-in components allowing translator 107 to be customized for virtually any application.

IT hardware 115 can include, for example, PCs, servers, storage devices, networking equipment, and other computing devices located in one or more data centers. For example, in various embodiments DCICS 105 can collect or obtain temperature data and/or utilization data from, for example, one or more processor cores within a server, bandwidth utilization data from one or more network switches or routers, storage capacity information from one or more storage devices, etc. DCICS 105 can send control instructions and/or signals to IT hardware 115; for example, DCICS 105 can cause a server in the data center to power cycle, increase/reduce internal fan speed, etc.

Virtualization layer 120 can include, for example, virtualization software for managing usage and provisioning of IT hardware (e.g., instances of VMWARE® software running on IT hardware 115). DCICS 105 can collect data about the status, hardware allocation, and hardware utilization of virtual machines resident on one or more servers. DCICS 105 can send instructions to virtualization layer 120, for example, via an API. For example, DCICS 105 can cause an instance of virtualization software to move a virtual machine to another physical server at a different geographic location.

Operating system 125 can include, for example, instances of MICROSOFT WINDOWS, LINUX, MAC OS X, UNIX etc. running on IT hardware 115 (natively or on virtual machines and/or partitions). For example, DCICS 105 can collect data about the status of the operating system, such as system load and which applications are running and/or loaded in memory. DCICS 105 can control data center hardware and software; for example, by sending instructions to operating system 125. In various embodiments, DCICS 105 can cause the operating system instance to execute and/or terminate an application.

Application 130 can include instances of applications (e.g., web server, enterprise management, database, payroll, supply chain, etc. software) running on IT hardware 115. For example, DCICS 105 can collect data about an application's activity level, execution schedule, and anticipated duration. DCICS 105 can send instructions to application 130. For example, DCICS 105 can initiate application 130, cause an application to execute a job, another application, a procedure, a data communication, etc.

User 135 can include applications and/or devices communicating with IT hardware 115 located in the one more data centers managed by DCICS 105. For example, DCICS 105 can collect data from user 135 about distributing workloads across IT hardware 115. DCICS 105 can send instructions to user 135.

Beneficially, by collecting data from and issuing instructions to data center infrastructure 110, IT hardware 115, virtualization layer 120, operating system 125, application 130, and user 135, DCICS 105 can more efficiently and completely monitor, analyze, manage, predict, decide, optimize and control the operation of data centers. For example, the efficiency of application 130 can be increased by utilizing data center operations data from data center infrastructure 110.

Figure 2:
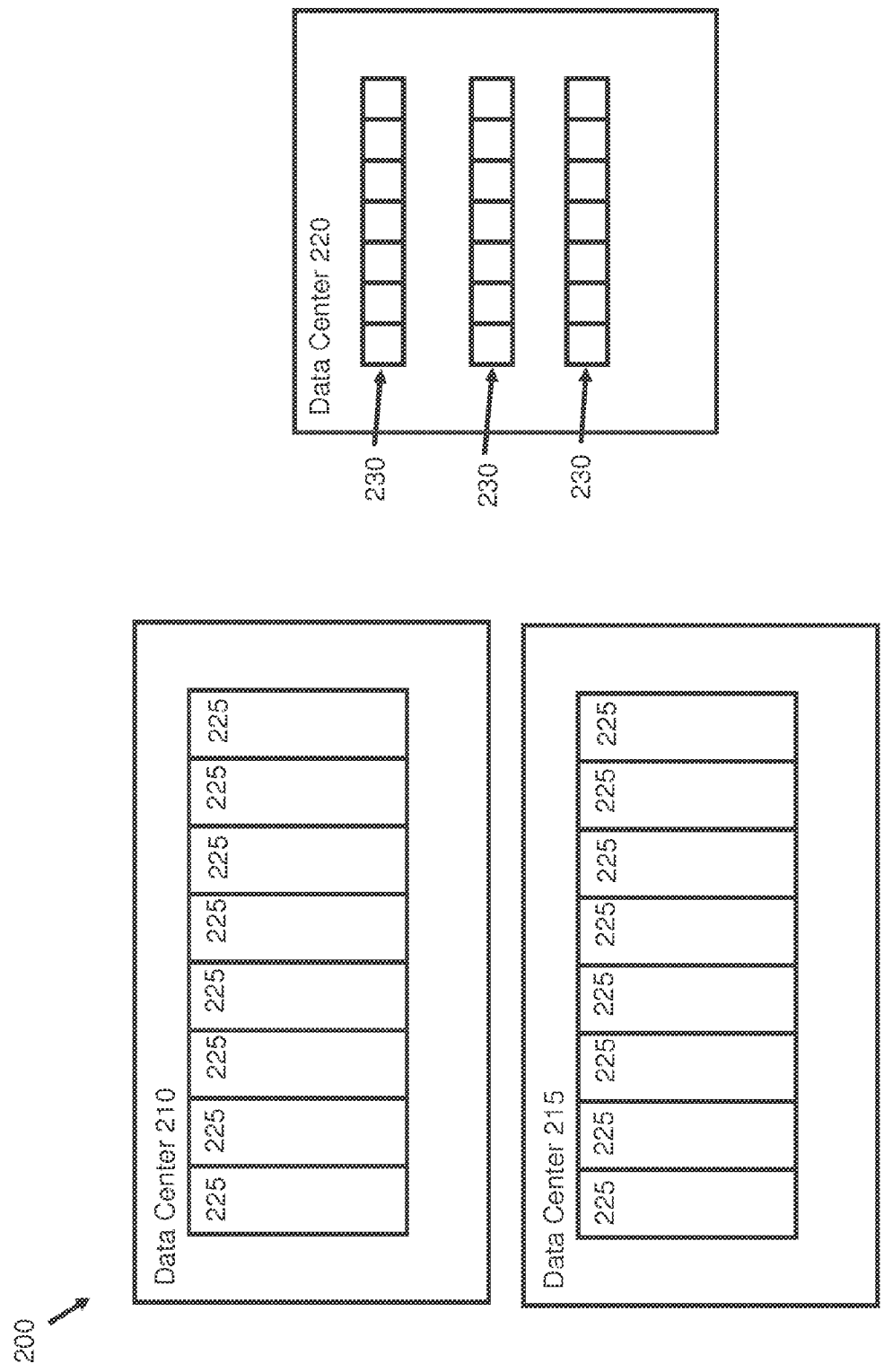
FIG. 2 illustrates a data center, in accordance with various embodiments.

FIG. 2 illustrates data center 200. Data center 200 can be composed of multiple data centers. As illustrated, data center 200 can include data center 210, data center 215, and data center 220. Data center 210 and data center 215 can be modular data centers. Data center 210 and data center 215 can include multiple data center modules 225. Data center modules 225 can contain IT equipment (not shown). Data center modules 225 can, for example, be modules as described in U.S. patent application Ser. No. 13/751,568 filed Jan. 28, 2013 and entitled "Modular Data Center." Data center 220 can be a traditional raised-floor data center, as is well known in the art. Data center 220 can contain IT equipment in rows 230.

Data center 200 can include resources in the same building. For example, data center 210, data center 215, and data center 220 can be housed in the same building. Data center 200 can include resources in geographically diverse locations. For example, data center 210 can be in the United States, data center 215 can be in Brazil, and data center 220 can be in Singapore.

Beneficially, the technology described herein can facilitate management and control of heterogeneous data centers and other IT, data communications, power distribution and climate control resources. For example, in various embodiments, DCICS 105 manages, coordinates and controls data centers including a mixture of traditional (e.g., "raised-floor") data centers and modular data centers that may be geographically diverse and include heterogeneous and/or non-standard configurations of data center infrastructure and IT assets.

Figure 3:
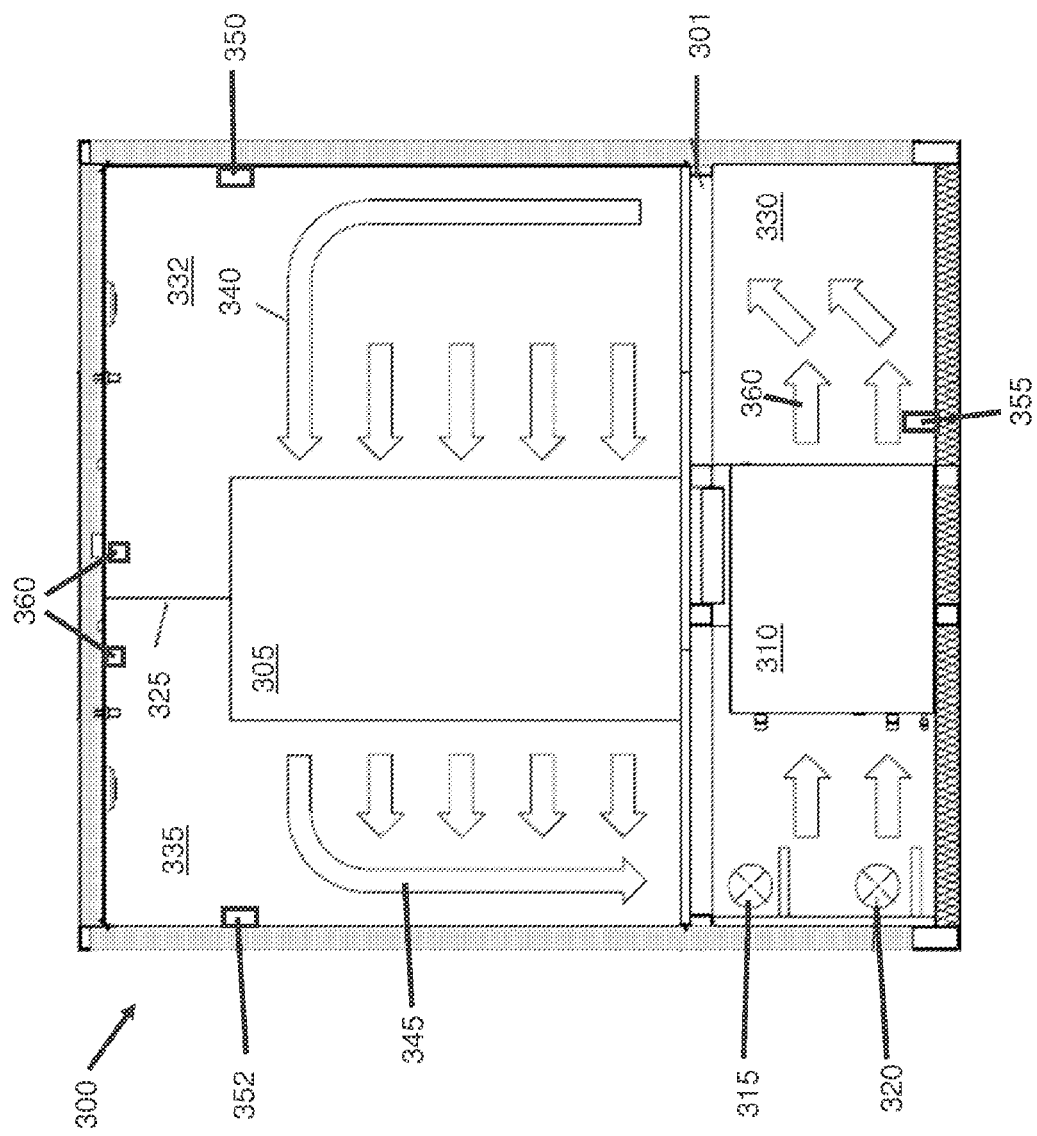
FIG. 3 depicts a cross-section view of a data center module, in accordance with various embodiments.

Referring now to FIG. 3, data center module 300 depicts a cross-section view of an embodiment of a data center module. One or more of modules 225 can be structured and/or operate as described with respect to data center module 300. Data center module 300 contains floor 301 that divides the interior of data center module 300 into above-floor space and sub-floor space. Data center module 300 can contain IT equipment 305. In the illustrated embodiment, data center module 300 contains air handler unit (AHU) 310, which is supplied chilled fluid by chilled fluid supply pipe 315 and fluid return pipe 320. In various embodiments, chilled fluid supply pipe 315 is connected to AHU 310 via a modulated valve. In various embodiments, the amount the modulated valve is open can be controlled via control instructions from DCICS 105. Data center module 300 contains flexible barrier 325.

IT equipment 305 can be in fluid communication with pressurized plenum 330. Pressurized plenum 330 can have one or more pressure sources, such as AHU 310. AHU 310 can include a variable-speed, variable-frequency-drive fan. AHU 310 can be in communication with pressurized plenum 330 and configured to increase the pressure within pressurized plenum 330. For example, in response to receiving an instruction from DCICIS 105 AHU 310 may activate its fan. IT equipment 305 can separate the above-floor space into cold aisle 332 and hot aisle 335. In the illustrated embodiment, cold aisle 332 and hot aisle 335 can provide technicians access to the IT equipment 305. Flexible barrier 325 can facilitate separation of cold aisle 332 and hot aisle 335 (alone and/or in conjunction with IT equipment 305). It will be recognized that the use of the term "aisle" is suggestive of some embodiments and that the spaces or areas described as cold aisle 332 and hot aisle 335 can be of any shape, configuration or size.

AHU 310 can increase the pressure within pressurized plenum 330 to generate a pressure differential between cold aisle 332 and hot aisle 335, causing air 340 to flow across and/or through IT equipment 305. The flow of air 340 across and/or through IT equipment 305 can remove heat from IT equipment 305, resulting in heated air 345. AHU 310, by use of, for example, a heat exchanger, can remove the heat from heated air 345. In various embodiments, AHU 310 utilizes a vapor-compression cycle heat exchanger. AHU 310 can transfer the heat to chilled fluid from chilled fluid supply pipe 315 and expel the heated fluid via fluid return pipe 320.

Data center module 300 can include temperature and/or humidity sensors 350 and 352, which can, for example, measure the temperature and/or humidity of air in cold aisle 332 and hot aisle 335, respectively. Data center module 300 can include AHU output temperature and/or humidity sensor 355, which can measure the temperature and/or the humidity of air leaving AHU 310. Data center module 300 can include pressure sensors 360 for measuring the differential pressure between cold aisle 332 and hot aisle 335. Data center module 300 can contain a power distribution unit (PDU) (not shown in FIG. 3). A PDU can distribute power to AHU 310, IT equipment 305, and other electrical equipment in data center module 300. A PDU can, for example, measure the power consumption of AHU 310 or IT equipment 305 individually and provide this data to DCICS 105.

Figure 4:
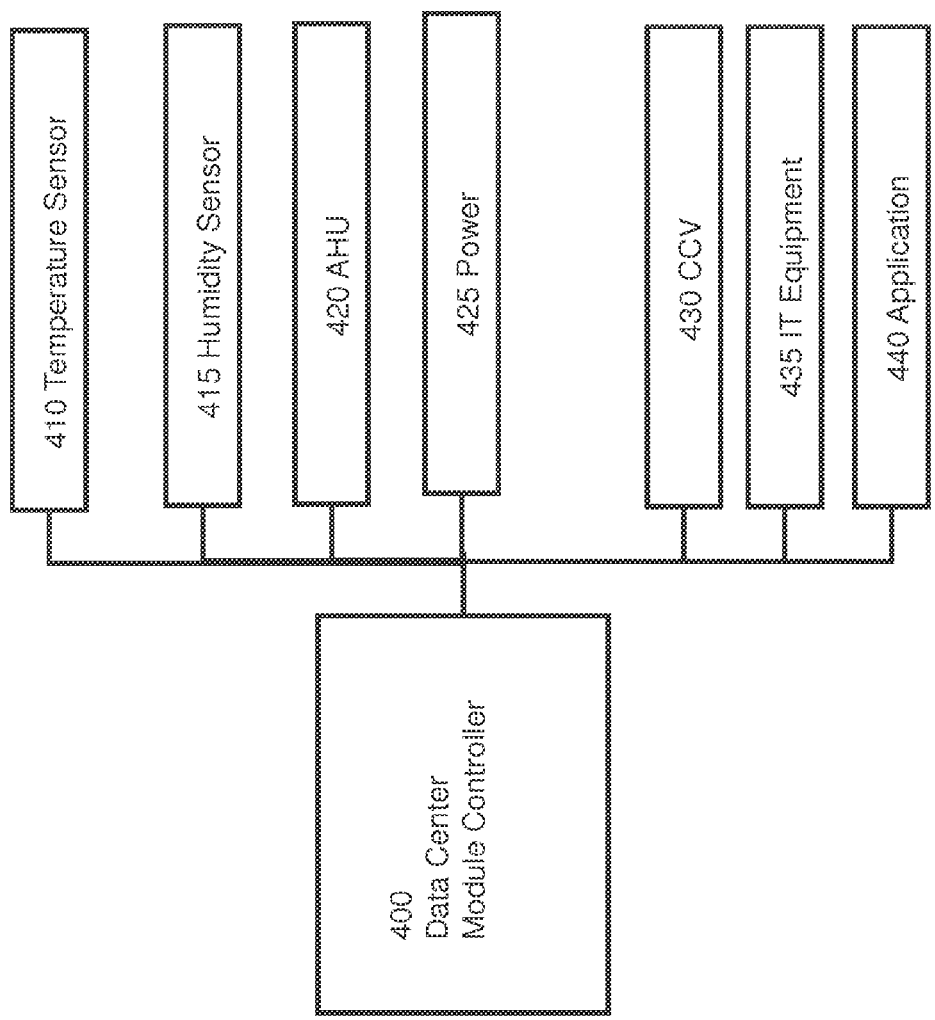
FIG. 4 depicts a data center module controller, in accordance with various embodiments.

FIG. 4 depicts data center module controller 400. Data center module controller 400 can be housed in data center module 300. In various embodiments, controller 400 comprises special-purpose hardware and software. Data center module controller 400 can collect data relating to the operation of data center module 300 and issue instructions to data center module 300 hardware. For example, data center module controller 400 can obtain (e.g., retrieve or receive) temperature sensor data (e.g., from temperature and/or humidity sensors 350 and 352 and AHU output temperature and/or humidity sensor 355). Data center module controller 400 can collect humidity sensor data (e.g., from temperature and/or humidity sensors 350 and 352 and AHU output temperature and/or humidity sensor 355). Data center module controller 400 can collect AHU data 420 (e.g., data relating to the operation of AHUs, such as operational status, fan speed, error status, power draw, etc.). Data center module controller 400 can collect power data 425 (e.g., power drawn by data center module 300 as a whole or by individual components within data center module 300, such as AHU 310 or IT equipment 305). Data center module controller 400 can collect chilled fluid valve data from CCV 430 (e.g., position data, error status, etc.). Data center module controller 400 can collect IT equipment data 435 (e.g., data relating to the operation of IT equipment in data center module 300, such as CPU utilization, CPU temperature, planar temperature, etc.). Data center module controller 400 can collect application data 440 (e.g., data relating to the operation of applications running on IT equipment 305 in data center module 300). In various embodiments, data center module controller 400 can store the collected data. In various embodiments, data center module controller 400 can provide the collected data to a data center management and control system, as described with respect to FIG. 5. In various embodiments, controller 400 is configured with software modules (e.g., object code or machine readable instructions) that enable receipt of control instruction from DCICS 105 and execution of the instruction to control a one or more of IT equipment 305.

In various embodiments, data center module controller 400 integrates safety, motion, discrete, and drive capabilities in a single controller. Data center module controller 400 may include compact I/O modules. In various embodiments, data center module controller 400 include: built-in RS-232 serial ports; built-in communication ports for EtherNet/IP or ControlNet networks; a communication interface module for I/O control and remote device configuration; compact I/O modules providing a compact, DIN-rail or panel mounted I/O system. Software modules or compiled machine language instructions may be developed, compiled and installed on data center module 400. In various embodiments, data center module 400 enables relay ladder, structured text, function block diagram, and sequential function chart editors to develop application programs which can be downloaded to data center controller 400 memory. For example, programs may send control instructions to module hardware and software components, measure outside air, humidity, damper positions, air flow rate of the fans, and more for the various equipment and device sensors wired to the I/O modules. In various embodiments, data center module controller 400 exchanges information with DCICS 105 in real-time.

Figure 5:
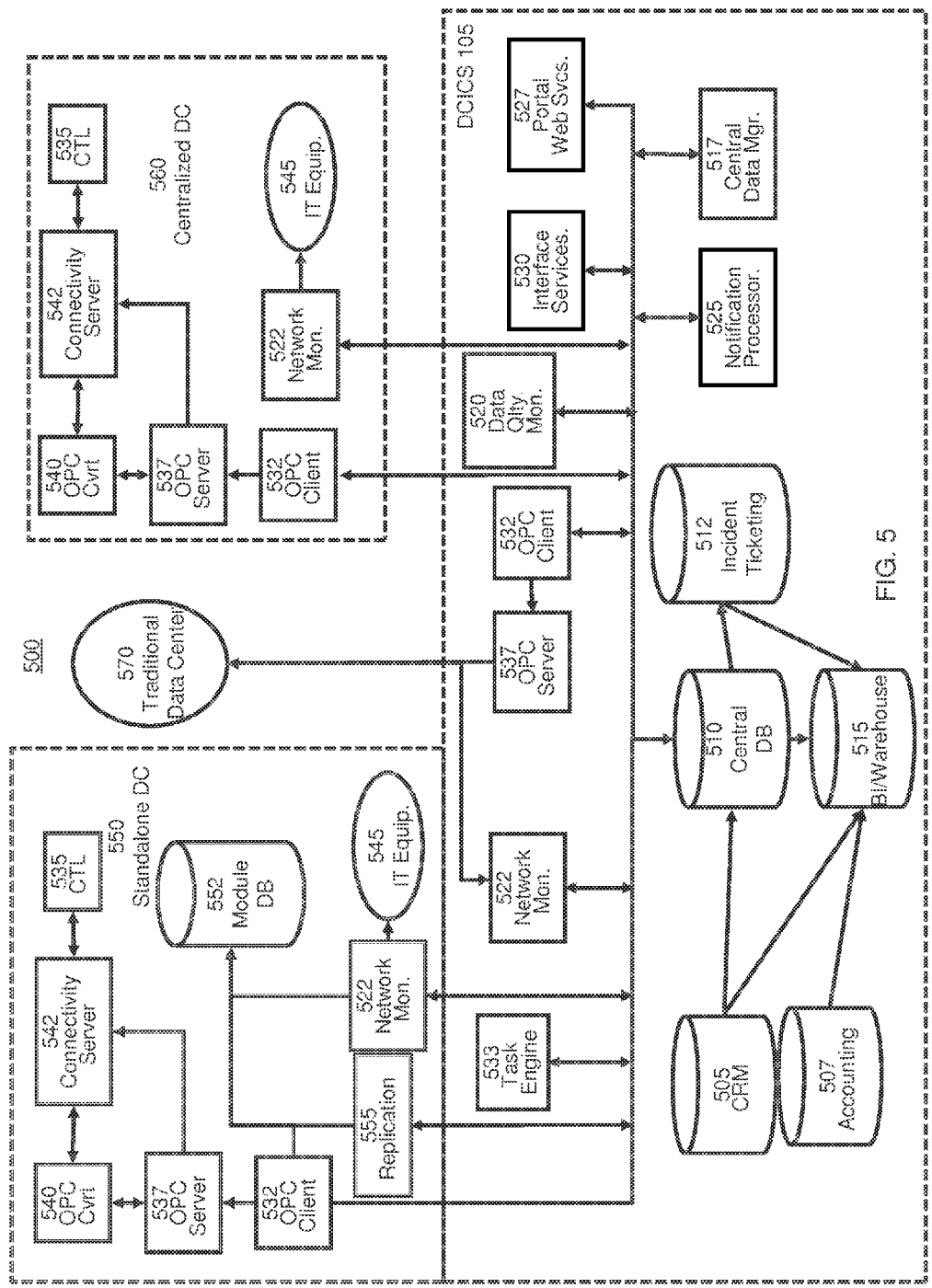
FIG. 5 depicts a logical view of a data center management system, in accordance with various embodiments.

FIG. 5 depicts a logical view of DCICS 105. CRM database 505 can be a Customer Relationship Management database. Sales proposals, quotes, and/or customer information can be stored on CRM 505. Accounting database 507 can be a system for financial reporting. Central database 510 can be a repository for any data related to the operation of the data centers managed by DCICS 105. Incident ticketing database 512 can be software that facilitates customer ticketing and incident reporting.

Business intelligence and data warehouse database 515 can include any data related to the operation of the data centers managed, tracked, controlled or stored by DCICS 105. In various embodiments, business intelligence and data warehouse database 515 can implement computer-based techniques used in identifying, extracting, and enable analyzing business data, such as sales revenue by products and/or departments, and/or by associated costs and incomes. Business intelligence and data warehouse database 515 can provide historical, current and predictive views of business operations. For example, business intelligence and data warehouse database 515 can perform reporting, online analytical processing, analytics, data mining, process mining, complex event processing, business performance management, benchmarking, text mining, forecasting and predictive analytics.

Central Data Manger 517 can access data from central database 510 and present it to a user (e.g., user 135 via a user interface of a client device, an application programming interface ("API"), etc.). Data quality monitor 520 can check data to verify that transactions are occurring and validate that the transactions are producing the expected results. For example, data quality monitor 520 can sample the database tables in central database 510 periodically to ensure that central database 510 is operating. In various embodiments, data quality monitor checks for data central database 510 that violates business rules and data quality monitor 520 creates and sends an email report on data validation issues.

Network monitor 522 can communicate with IT equipment 545 to determine, for example, the status of IT equipment 545. In various embodiments, network monitor 522 is an extensible tool that brings measurements from networked devices into DCICS 105 where they can be stored and viewed. In various embodiments, network monitor 522 can monitor, for example: devices that support SNMP (simple network monitoring protocol); VMWare® virtual machines; EMC® storage arrays; other types of devices utilizing Microsoft Windows PowerShell.

Notification processor 525 can generate notifications based on the occurrence of an event, data, forecast, etc. In various embodiments, notifications may be system notifications, emails, text message, automated phone calls, tweets, operating system level messages (e.g. iOS notification), etc.

Portal web services 527 can manage web-based customer interactions. In various embodiments, data from portal web services 527 can be directed to customers and/or data center management personnel (e.g., for addressing customer issues). Interface services 530 can provide web-based user interfaces.

Open Process Control (OPC) Server 537 is a software application that acts as an API or protocol converter. In various embodiments, OPC Server 537 can connect to a device such as, for example, a programmer logic controller, distributed control system, remote terminal unit, and/or or a data source such as a database or user interface, and translate the data into a standards-based OPC format.

OPC client 532 can provide a logger to process real-time data from OPC server 537. In various embodiments, OPC client 532 can permit parallel writes as well as priority driven queuing of writes. OPC server 537 can receive data center operations data from controller 535 (e.g., a controller located in, or operatively connected to, a data center module, such as data center module controller 400). While the illustrated embodiment utilizes OPC, data can be exchanged in any format. Connectivity server 542 can facilitate access to controller 535. OPC converter 540 can convert data from connectivity server 542 to OPC format, as necessary.

DCICS 105 can manage and control various types of data centers. DCICS 105 can manage standalone data center 550. Standalone data center 550 can include one or more data center modules. Standalone data center 550 can use module database 552 to store collected data center operations data for standalone data center 550. In various embodiments, in the event of a network outage between standalone data center 550 and central database 510, module database 552 can be used to monitor and/or control standalone data center 550. Replication server 555 can maintain synchronization between module database 552 and central database 510.

Centralized data center 560 can operate in a manner similar to standalone data center 550. In various embodiments such as the one depicted in FIG. 5, centralized data center 560 stores data to a central database (e.g., central DB 510). In various embodiments, in the event of a network outage between centralized data center 560 and central database 510, data relating to the operation of centralized data center 560 may not be available centrally but the data relating to the operation of centralized data center 560 can be buffered and provided to central database 510 when the connection is restored.

Traditional data center 570 may be, for instance, a raised floor data center. In various embodiments, traditional data center 570 can include sensors (e.g., temperature, humidity, pressure, motion detection, access control, acoustic, biometric, etc.). Sensor data can be collected by OPC server 537. In various embodiments, OPC server 537 can communicate with IT equipment located in traditional data center 570. In various embodiments, OPC server may exchange data with translator 107 and/or data center module controller 400 (e.g. CTL 535 in FIG. 5).

In various embodiments, DCICS 105 can track components (e.g., logical and physical hardware, software, systems) of data centers. In various embodiments, DCICS 105 can group components of the data centers into partitions. The term partition includes any logical or physical grouping of one or data center assets (hardware or software). For example, a partition can be defined to include a single server, multiple data center modules and everything contained therein, and/or a partition can be defined to include an entire data center or group of data centers. In various embodiments, a partition may be associated with individual data center assets, individual sensors, etc.

Task engine 533 monitors changes to data collection points. In various embodiments, in order to monitor changes to data, task engine 533 may poll the data collection points, poll a database (e.g. central DB 510), receive data from a database (e.g via a database trigger), receive changes made by a user, etc. In various embodiments, task engine 533 detects a change made by a user to threshold or "setpoint" information associated with one or more data collection points. In an embodiment, task engine 533 includes an extender that enables modular plug-ins to be added to a task manager (e.g. of a computer's operating system) so that DCICS 105 can perform tasks, such as commanding an application, system or computing environment (e.g., VMware environment) to gracefully shut down or start up a virtual machine. In various embodiments, task engine 533 associates data collection points to a shell command utility of an operating system (e.g. Windows PowerShell commands), allowing commands to be executed in response to users changing the setpoints (e.g. thresholds) data collection point from within DCICS 105. Evaluation Engine An exemplary technique for managing the environmental conditions (e.g., provide cooling for IT equipment) within a data center module is described below with reference to data center module 300 of FIG. 3. As described above, one or more AHUs can be used to manage the environmental conditions (e.g., provide cooling for IT equipment) within a data center module. In various embodiments, a cold aisle temperature set point (e.g., a desired air temperature in cold aisle 332) can be provided. For example, a user 135 may use dashboard 535 to update central database 510 with set point information. In various embodiments, DCICS 105 may derive or calculate a cold aisle temperature setpoint can, based on, for example, the cooling needs of IT equipment 305, the comfort of operators of IT equipment 305, etc. AHU 310 can provide chilled air 360 to maintain air 340 in cold aisle 332 at approximately the cold aisle temperature set point. In various embodiments, AHU 310 can provide chilled air 360 to maintain air 340 in cold aisle 332 at approximately the cold aisle temperature set point by controlling the amount of energy extracted (e.g., cooling) from heated air 345.

In various embodiments, aspects of the operation of AHU 310 can be monitored and controlled by a DCICS (e.g. DCICS 105). For example, DCICS 105 generate and communicate instructions to modulate a fan speed of AHU 310 and a valve that controls the flow rate of chilled fluid (chilled fluid control valve or CCV) into AHU 310 and data center module controller 400 can issue the instructions to the respective hardware devices. Modulating fan speed or CCV can affect the temperature of air 340 in cold aisle 332. For example, modulating the CCV to increase the flow rate of chilled fluid into AHU 310 can lower the temperature of air leaving AHU 310 (e.g., chilled air 360), thereby lowering the temperature of air 340 in cold aisle 332. As another example, modulating the fan speed of AHU 310 can increase the amount of air leaving AHU 310 (e.g., chilled air 360), thereby lowering the temperature of air 340 in cold aisle 332. In various embodiments, modulation of the fan speed and/or CCV can be used to maintain air 340 in cold aisle 332 at approximately the cold aisle temperature set point.

Figure 6:
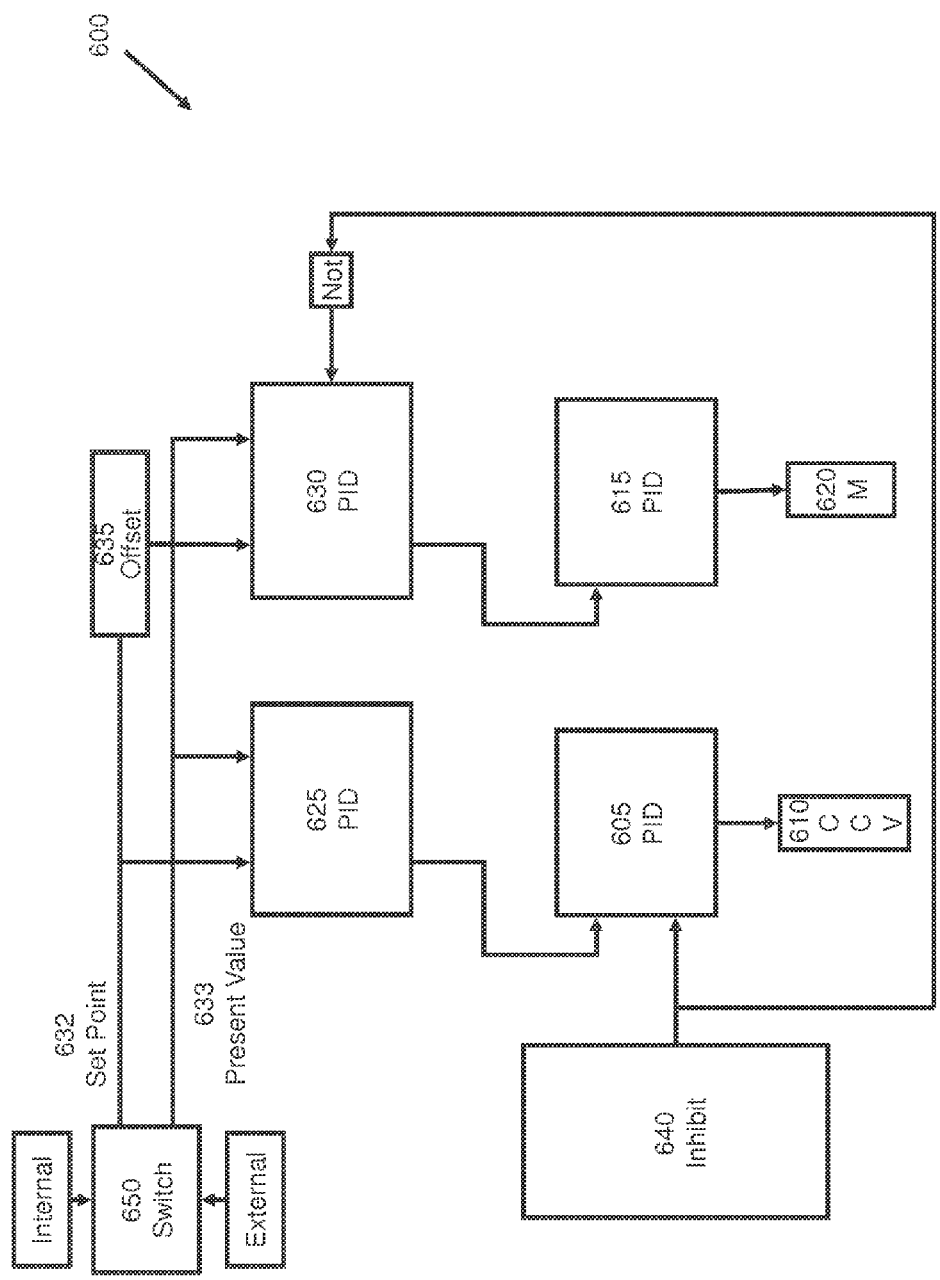
FIG. 6 depicts a control system for a data center module, in accordance with various embodiments.

FIG. 6 depicts a control system 600 for data center module 300. As illustrated in FIG. 6, in various embodiments control system 600 is a cascaded control loop. Proportional-integral-derivative controller (PID) 605 can control CCV 610 (e.g., the CCV for AHU 310). For example, PID 605 can receive a temperature set point for air leaving AHU 310 (e.g., chilled air 360). PID 605 can receive the present temperature of air leaving AHU 310 (e.g., chilled air 360), e.g., from AHU output temperature and/or humidity sensor 355. PID 605 can modulate CCV 610 to maintain the temperature of air leaving AHU 310 (e.g., chilled air 360) at approximately the temperature set point for air leaving AHU 310. PID 615 can control fan motor 620 (e.g., the fan motor in AHU 310).

PID 625 can control PID 605 (e.g., by providing a set point temperature for air leaving AHU 310 (e.g., chilled air 360)). PID 630 can control PID 615 (e.g., by providing a set point temperature for air leaving AHU 310 (e.g., chilled air 360)).

Control system 600 can receive a set point 632 (e.g., cold aisle temperature set point). Control system 600 can receive a present value 633 (e.g., the present temperature of air 340 in cold aisle 332 via temperature and/or humidity sensor 350). Based on the difference between the present value and the set point, PID 625 can increase or decrease the set point provided to PID 605. For example, if the present value exceeds the set point (e.g., the present temperature of air 340 in cold aisle 332 exceeds the cold aisle temperature set point), PID 625 can lower the set point temperature for air leaving AHU 310 provided to PID 605. Based on the difference between the present value and the set point 632, PID 630 can increase or decrease the set point provided to PID 615.

In various embodiments, lowering temperature of the chilled air 360 by increasing the flow rate of chilled fluid into AHU 310 can be more efficient and/or preferable to increasing the fan speed of AHU 310. Offset 635 can be used to increase the set point received by PID 630, thereby causing PID 630 to decrease the set point provided to PID 615 at a higher present value temperature than the present value temperature at which PID 625 can decrease the set point provided to PID 605.

Inhibit 640 can inhibit decreases in the temperature set point provided to PID 605 (e.g., temperature set point for air leaving AHU 310 (e.g., chilled air 360)). In various embodiments, inhibit 640 can prevent the temperature set point provided to PID 605 from going below a dew point temperature, a dew point temperature range, or a predetermined threshold above the dew point temperature. In various embodiments, inhibit 640 can prevent the temperature set point provided to PID 605 from going lower when CCV is fully open. In various embodiments, when inhibit 640 prevents decreases in the temperature set point provided to PID 605, inhibit 640 prevents PID 630 from increasing the temperature set point provided to PID 615.

In various embodiments, present value 633 can be the cold aisle temperature. In various embodiments, present value 633 can be the hot aisle temperature (e.g., the temperature of air 345 in hot aisle 335, as measured by temperature and/or humidity sensor 352). In various embodiments, present value 633 can be the planar or processor temperature of IT equipment. In various embodiments, switch 650 can control whether present value 633 is from an external source (e.g., sensor measuring the temperature of IT equipment planar or processor) or internal source (e.g., sensor measuring the cold aisle temperature).

While the described embodiment controls AHU 310, it should be appreciated that control system 600 can control the operation of one or more data center assets (e.g., IT infrastructure hardware). In various embodiments, a module (e.g., module 225 of FIG. 1) can contain multiple AHUs (e.g., 4, 6, or 8 AHUs). Control module 600 can control the CCV and fan motor for each of the AHUs as described above. In various embodiments, a module can be divided into zones (e.g., divided into two zones) that can each operate as described above (e.g., the operation of AHUs in each zone are controlled separately from AHUs in other zones based on set points for each zone).

In various embodiments, an AHU can be "In Service" or "Out of Service." An "In Service" AHU can have its fan speed set to greater than 0% (e.g., the fan is rotating) and the CCV can be set to greater 0% (e.g., the valve permits chilled fluid to enter the AHU). An "Out of Service" AHU can have its fan speed set to 0% (e.g., the fan is not rotating) and the CCV can be set to 0% (e.g., the valve is closed). In various embodiments one or more AHUs can be "In Service" and operate as described above. In various embodiments, when inhibit 640 prevents decreases in the temperature set point provided to PID 605, one or more "Out of Service" AHUs can be changed to "In Service," thereby increasing the cooling capacity available.

In various embodiments, control system 600 can be housed in a data center module (e.g., in pressurized plenum 330 of data center module 300). In various embodiments, a data center module controller (e.g., data center module controller 400) can implement control system 600. In various embodiments, control system 600 can be a part of DCICS 105.

Figure 7:
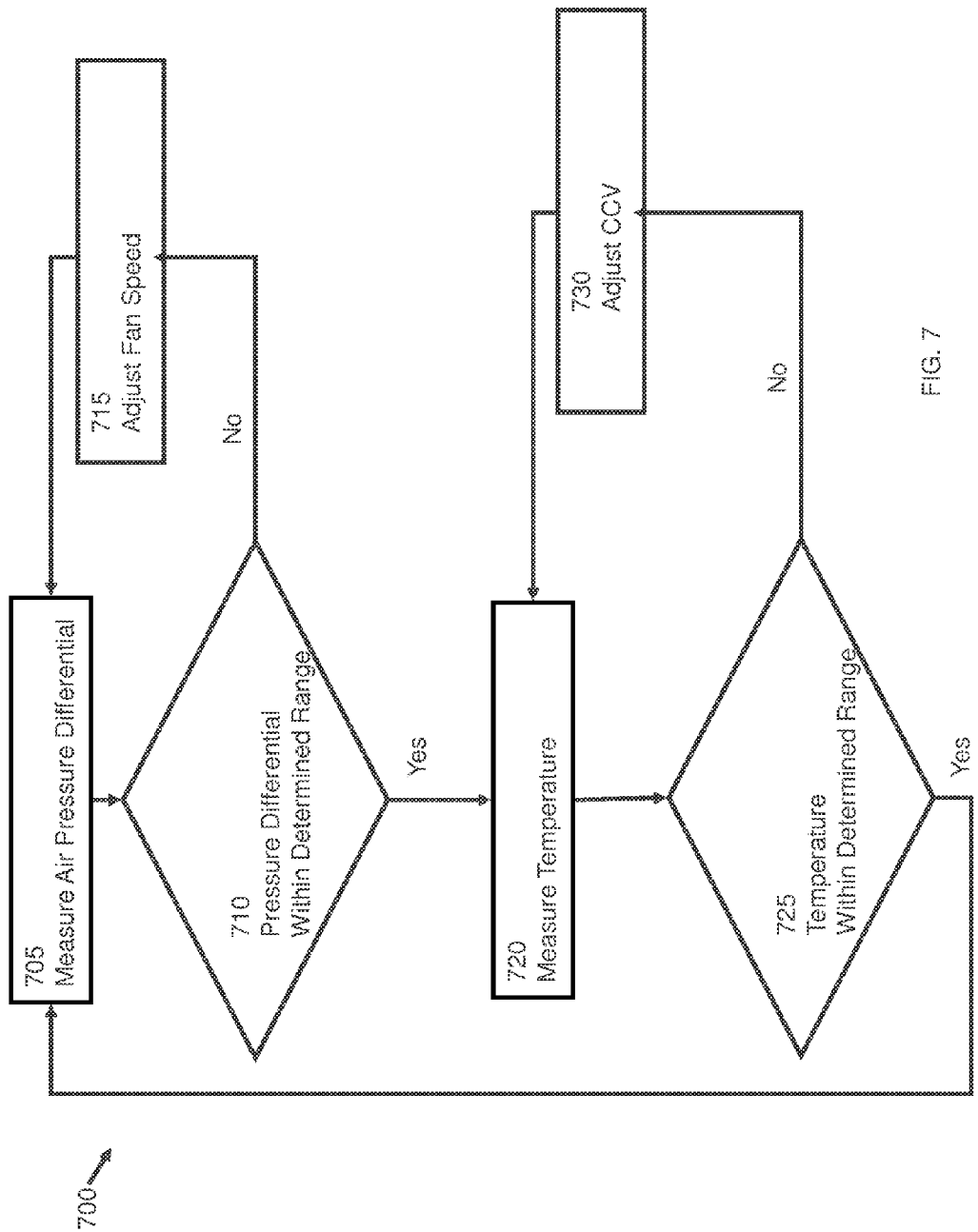
FIG. 7 is a flow chart depicting a method of operating a data center module, in accordance with various embodiments.

FIG. 7 is a flow chart 700 depicting a method of operating a data center module. At step 705, an air pressure differential is measured. For example, with reference to data center module 300, pressure sensors 360 can measure the differential pressure between cold aisle 332 and hot aisle 335. At step 710, it is determined if the pressure differential is within a predetermined range. For example, a particular pressure differential can facilitate air flowing from cold aisle 332, though IT Equipment 305. If the pressure differential is not within the predetermined range, the fan speed in one or more AHUs can be adjusted at step 715. For example, if the measured pressure differential between cold aisle 332 and hot aisle 335 is below the predetermined range, the speed of the fan in AHU 310 can be increased, thereby increasing the pressure in cold aisle 332. If the measured pressure differential between cold aisle 332 and hot aisle 335 is above the predetermined range, the speed of the fan in AHU 310 can be decreased, thereby decreasing the pressure in cold aisle 332.

If the pressure differential is within the predetermined range, the method proceeds to step 720 where the temperature is measured. For example, the temperature of air 340 in cold aisle 332 can be determined via temperature and/or humidity sensor 350. At step 725, it is determined if the temperature is within a predetermined range. For example, a desired air temperature range in cold aisle 332 can be identified (e.g., a cold aisle temperature set point). If the measured temperature is not within the predetermined range, the CCV can be adjusted at step 730. For example, as described above, modulating the CCV to increase the flow rate of chilled fluid into AHU 310 can lower the temperature of air leaving AHU 310 (e.g., chilled air 360), thereby lowering the temperature of air 340 in cold aisle 332. If the measured temperature is within the predetermined range, the method returns to step 705.

The technology described herein can include techniques for monitoring, analyzing and controlling a data center. As described above, DCICS 105 can access data center operations data associated with, for example data center infrastructure 110, IT hardware 115, virtualization layer 120, operating system 125, application 130, and user 135 shown in FIG. 1. The data center operations data can be analyzed, thereby permitting real-time or near real-time monitoring of the operation of the data center.

In various embodiments, DCICS 105 accesses data associated with various operational systems, or subsystems, of a data center infrastructure. Such systems include environmental, information technology, power delivery, energy recovery, etc. Data is accessed via "data collection points" which, in various embodiments, may include data sources, sensors, detectors, status indicators, operational control indicators, mechanical settings, IT hardware characteristics and state information, software system attribute and setting parameters, etc. For example, such data access points can include: controllers, humidity sensors, fire detectors, smoke detectors, high sensitivity smoke detectors, very early smoke detection apparatuses, moisture detectors, spot leak detectors, pressure sensors, intrusion detectors, valve indicators (e.g., control return valve position indicators, supply valve position indicator, etc.), power input monitors, power output monitors, fan speed indicators and fan direction indicators.

In various embodiments, such environmental systems include: Fire Detection (e.g., alarm, high sensitivity smoke detector ("HSSD")); Fire Suppression: (alarm, panel reset); Temperature (e.g., internal, external, cold aisle, hot aisle, etc.); Pressure (e.g., module differential pressure); Humidity (relative humidity, dew point, control humidity); and Lead detection (spot leak detectors).

In various embodiments, such IT systems include: Server (e.g., server CPU, RAM, disk, fan speed, temperature); Network (e.g., throughput, routing information, firewalls, alerts, SNMP based); Virtualization (e.g., manage and monitor both virtual workloads); IT hardware characteristics and state information; and Software system attribute and setting parameters.

In various embodiments, such power delivery systems include: Generators (e.g., generator load and status, fuel level, oil pressure, remote control stop and start, etc.); UPS (e.g., input and output, total load of UPS, power factor; PDU (e.g., branch circuit monitoring, input/output load, etc.); and Switchgear (e.g., input/output bus, demand current, power factor, etc.).

In various embodiments, such energy recovery systems include: Chillers (e.g., supply and return temperature, system pressure, control outlet temperature, set point, etc.); Air Handlers (e.g., inlet/outlet temperature, control coil demand, fan mode, fan speed, fan on/off, filter hours, etc.); and Valves (e.g., heat removal, differential pressure, flow, valve position, control return valve position, supply valve position, etc.).

The technology can include techniques for specifying how data center operations data is identified, aggregated and analyzed. In various embodiments, the technology includes a scripting language for specifying how data center operations data is aggregated and analyzed along with aggregating and analyzing the data as specified. In various embodiments, an expression in the language for specifying how data center operations data is aggregated and analyzed can have the following syntax:

[input set]|>operation

In the expression above, input set is the source (e.g., set of data collection points in the data center) from which to collect data center operations data to aggregate and analyze, and operation is the operation to perform on the input set. input set can be specified by, for example, data collection point type, device type, partition membership, containing system, etc. from which to collect the data center operations data. The input set can include other expressions. Example input sets follow. In the examples, the input set members are specified using Uniform Resource Names, but in various embodiments other manners of identifying the input set members can be used.

[urn:NID:sensortype:Temp]—specifies the input set as data from all temperature sensors in the data center.

[urn:NID:partition:1918 & urn:NID:sensortype:Temp]—specifies the input set as data from all temperature sensors in partition 1918.

[urn:NID:device:ba3e38b9-de9d-e011-ba7c-005056876935 & (urn:NID:sensortype:136|urn:NID:sensortype:1086)]—specifies the input set as data from all power meters of type 135 and 1086 in the PDU identified as urn:NID:device:ba3e38b9-de9d-e011-ba7c-005056876935.

In the expression above, operation is the operation to perform on the data from the input set. For example, the operation can be a mathematical equation, algorithm or stochastic method. In various embodiments, operations include SUM (e.g., the summation of all data from sensors in input set), MAX (e.g., the maximum value of all data from sensors in input set), MIN (e.g., the minimum value of all data from sensors in input set), MEAN (e.g., the mean of all data from sensors in input set), STDEV (e.g., standard deviation) and COUNT (e.g., the number of data items from sensors in input set). Performance of the operation on data from the data collection points in input set can produce a result (e.g., a numeric value).

In various embodiments, the result of an expression of the form [input set]|>operation can be used in an arithmetic operation, such as addition, subtraction, division, or multiplication. In various embodiments, data from a single data collection point (e.g. a single sensor) or a plurality of data collection points can be used in an arithmetic operation with the result of an expression of the form [input set]|>operation.

DCICS 105 can include an execution engine for performing the aggregation and analysis specified by an expression. The technology can receive an expression specifying how to aggregate and analyze data center operations data (e.g., in the syntax above) and aggregate and analyze the data as specified. In various embodiments, DCICS 105 can receive an expression (e.g., as a text string, in any non-compiled form, etc.). The expression can indicate a set of data collection points within one or more of data center 550, 560, and/or 570 and an operation to perform on data from those sensors. In various embodiments, DCICS 105 can generate machine code instructions based on the expression (e.g., by just-in-time compilation), wherein the machine code instructions include instructions to aggregate and analyze the data as specified.

DCICS 105 can execute the machine code instructions, generating a result of the operation. In various embodiments, DCICS 105 can query a database containing data center operations data (e.g., central database 510) to collect data from data collection points specified in the input set. In various embodiments, the DCICS 105 can collect the data directly from the data collection points (e.g. directly from a sensor, from a sensor via a translator, from a sensor via an OPC client, etc) specified in the input set.

In various embodiments, the result can be interpreted by DCICS 105, shown on a display and/or stored to a data base (e.g., central database 510). In various embodiments, DCICS 105 determines a control instruction based upon the result and executing the control instruction causes a change in the operational state of a data center and/or a data center asset (e.g. data center system, IT hardware, software, etc.).

In various embodiments, DCICS 105 can update the result of an operation when underlying data changes. For example, if the expression specifies averaging all temperature data from all temperature sensors in a data center module, DCICS 105 can update the result of the operation whenever data from one or more of the temperature sensors changes. In various embodiments, DCICS 105 determines that point data from at least one of the data collection points has changed and executes, based upon the point data, machine code instructions to produce a second result of an operation. DCICS 105 may further determine, based upon the second result, a second control instruction.

Embodiments of this disclosure include systems and methods of monitoring, analyzing and controlling data centers and related hardware and software. In an embodiment, a DCICS determines, based upon a first expression, a first operation and data collection points associated with data center assets. Data collection points may include sensors, indicators, detectors, system data, etc. In various embodiments, the expression may be obtained from a database, received via an API, received via user input, received or obtained from another system or a hardware device, etc. In various embodiments, the expression may be derived or generated by the DCICS based upon, for example, other expressions, data or events.

DCICS interprets and/or analyzes the expression and generates machine code instructions that may include, for example, instructions to obtain the first point data from the data collection points and to perform the operation based upon the first point data. In various embodiments, the instructions may include instructions for obtaining, receiving or retrieving the first point data. In some situations, the operation may be recursive and/or dependent upon the first point data. For instance, the operation itself may iterate and one or more interactions may themselves be dependent upon a nested calculation, updated data, simulated data, a previous iteration, etc.

DCICS 105 executes the machine code instructions to produce a first result of the first operation. In various embodiments, in response to producing the first result, DCICS 105 examines or analyzes the first result and determines a first control instruction. Executing the first control instruction causes a change in an operational state of at least one of a data center asset and a data center.

In various embodiments, determining the first control instruction, may comprise generating the first control instruction, analyzing historical data, analyzing external data, performing a forecast, simulation or other predictive analytics, performing an optimization, receiving user input, etc. For example, DCICS 105 may process an expression (or a plurality of expressions) that is associated with the processing capability (e.g. load, utilization, etc.) on a particular set of data center assets such as servers, storage devices and/or networking devices. DCICS 105 analyzes the result of the operation associated with the expression and may determine that those data center assets are at risk of failing or performing below a required performance threshold. DCICS 105 may examine, for example, one or more of historical data, data center asset profile information, performance data, capability data, service level agreement data and performance needs forecasts.

Based upon this analysis, DCICS 105 may determine that a new operational state of the data center that is achieved by moving a software application to a different set of data center assets would help mitigate operational risk. DCICS 105 may identify a new or preferred configuration, identify a workflow to implement the change and generate instructions for executing such a change.

In various embodiments, DCICS may at least one of execute, partially execute the control instruction, and communicate the control instruction to a hardware device (e.g. controller 400) and/or software program for execution.

In various embodiments, the control instruction may include machine code instructions, an API call, an electrical signal, a trigger, object code, script, etc. Executing the control instruction causes a change in the operational state of a data center, data center asset and/or or a data center system. The control instruction may include instructions that cause, for example, moving data from a first data storage device to a second data storage device, moving a software application from a first computing device to a second computing device, terminating a software application, initiating a software application, initiating a virus protection strategy, implementing an intrusion prevention strategy, creating a user permission, revoking a user permission, shutting down a computing device, adjusting an operating temperature, initiating a fire suppression system, turning on an air handler, shutting down an air handler, adjusting a fan speed, adjusting a valve, locking a door, unlocking a door, locking an access panel, and unlocking an access panel.

In various embodiments, moving a software application from a first computing device to a second computing device may include the first computing device in a separate physical location from the first computing device, the first computing device and/or the second computing device being virtual machines, and/or creating a virtual computing device.

DCICS 105 can verify the change in the operational state. For example, DCICS 105 obtains data from data collection points, analyzes the data and determines whether the desired operational state has been achieved. In various embodiments, DCICS 105 may generate an expression for verifying that the operational state has been changed. Generating an expression may include one or more of deriving, calculating, or receiving the expression.

In various embodiments, verifying the change in the operational state may include determining a control operation result and/or analyzing second point data, where the control operation result is based upon the executing the first control instruction and where the second point data is obtained from the data collection points. The control operation result might be determined and/or obtained, for example, from the controller, a database and/or data collection points. In various embodiments, DCICS 105 may analyze the control operation result, the second point data and/or the change in the operational state, and determine a second operation or a second expression.

In various embodiments, DCICS 105 can use, for example, one or more of a business rule, a proprietary algorithm, external input, an interfacing system, artificial intelligence, simulations and other deterministic or stochastic predictive analytics to determine operational states of data centers or data center assets, evaluate or predict data center asset attributes (e.g., risk state, power capability, physical space, cooling capability, networking capability, redundancy capability, geographic proximity, etc.).

DCICS 105 can develop alternative strategies for transitioning to an optimal (or preferred) operational state and/or minimizing risk for data center assets such as, for example, a data center, a plurality of data centers, a partition, an application, a functional capability (e.g. combination of application and performance capabilities), an enterprise's IT infrastructure, etc. Such data center assets may be physically located in multiple data centers and/or in geographically diverse locations. In developing such alternative strategies, DCICS 105 can access profile, product, configuration, sales, utilization, performance, constraint and data center asset attribute data from a database such as central database 510, BI Warehouse 515, CRM 505, accounting 507, etc. In various embodiments, DCICS 105 includes a complete set of data entry, design and maintenance graphical user interfaces that enable design, entry, maintenance and visualization of data center asset information.

Based upon, for example, data collected, determined operational states and alternative strategies developed, DCICS 105 can direct control mechanisms to manipulate operational conditions and configurations and transition data center assets (e.g., hardware and software) to new operational states. For example, DCICS 105 may send an instruction to data center module controller 400, to translator 107, to OPC client 537 and/or directly to a data center hardware or software component.

In general, DCICS 105 can collect data from one or more data sources, where each data source of the one or more data sources relates to the operation of the data center. For example, as described above, the DCICS 105 can collect, access and/or obtain data from data center infrastructure 110, IT hardware 115, virtualization layer 120, operating system 125, application 130, and user 135. Based on the collected data, the technology can identify a current operational state of the data center. Generally, an operational state refers to a past, present or future status of a data center asset or component, a partition or grouping of data center assets, an entire data center, and/or multiple data centers.

In various embodiments, DCICS 105 determines one or more alternative operational states for the data center based on, for example, the current operational state, a portion of the collected data, and one or more pre-defined criteria. DCICS 105 can identify a desired operational state of the one or more alternative operational states. The technology can utilize one or more data center controls to transition the data center to the desired operational state.

DCICS 105 employs intelligent control to optimize data center operations. In various embodiments, DCICS 105 accesses inventory data, operational data, historical data and external data (collectively, "input data"), determines data center optimization dimensions, produces predictive data, determines an optimization action based upon data center optimization dimensions, the predictive data and input data, generates an optimization instruction based upon the optimization action. Execution of the optimization instruction causes a change in an operational state associated with the data center operations. In various embodiments, DCICS 105 is configured to collect data in order to verify and/or validate the change in the operational state.

Data center optimization dimensions may include, for example, reliability, redundancy, resiliency, risk, latency, efficiency, cost and threat avoidance. In various embodiments, a redundancy rating of 2N, N+1, N, etc. may be assigned to certain power and cooling capabilities.

In various embodiments, accessing input data comprises identifying and analyzing the input data. For example, identifying input data may include receiving input, obtaining from a data source, calculating and forecasting. The data source may include, for example, a historical database (e.g., central DB 510, BI Warehouse 515), a customer relationship management database (e.g., CRM 505), a data warehouse (e.g., BI Warehouse 515), a product catalog, an accounting system, the internet, a government data source, a vendor database, a utility system, a power system, a security system, a network provider system, and data collection points associated with the data center operations.

Analyzing the input data may include analyzing a plurality of data center assets based upon optimization dimensions. For example, DCICS 105 may determine that a suite of applications enabled by a data center should be moved in order to reduce latency, balance a load and free up some physical space. DCICS 105 may analyze a number of data center assets based upon optimization dimensions (e.g., reliability, resiliency, risk, latency, efficiency, cost and threat avoidance) and based upon data center asset attributes (e.g., risk state, power capability, physical space, cooling capability, networking capability, redundancy capability, and geographic proximity).

In various embodiments, analyzing the input data includes retrieving, mining, parsing, validating, obtaining and/or analyzing the input data to identify at least one of customer data, configuration data, product data, sales data, service level agreement (SLA) data, processing requirements, storage requirements, network bandwidth requirements, cost data, revenue data, and revenue by product data.

In various embodiments, DCICS 105 can identify a plurality of optimization actions. Identifying an optimization action can include DCICS 105: performing a proprietary algorithm; performing a simulation; performing artificial intelligence; performing a stochastic method; receiving user input; and executing a linear programming model. Based upon the optimization dimensions, DCICS 105 may determine an optimization score for each of the identified optimization actions. For example: a redundancy optimization dimension analysis may ensure that alternative data center assets under consideration have sufficient cooling and/or power redundancy ratings in order to support processing, storage and network capacity needed; a latency optimization dimension analysis may ensure that alternative data center assets under consideration have sufficiently high network bandwidth capability and low latency estimations in order to support business objective and/or service level agreements.

In various embodiments, DCICS 105 monitors and controls physical security of data centers. For example, the DCICS 105 can monitor the physical security of a partition, analyze collected data, perform forecasts, simulations, and risk analysis, develop scenarios for improving the operational state, pick a preferred scenario, develop a set of actions (e.g. workflow) to implement the new operational state, and execute or communicate control instructions to implement the actions and adjust the operational state (e.g., to improve physical security).

Individuals and/or groups of individuals can be assigned physical access rights to data centers and data center assets. Exemplary rights include entry through exterior doors of the data center, entry through interior doors of the data center, entry through data center module doors, access to IT Hardware cabinets, access to particular infrastructure equipment, etc.

DCICS 105 can obtain data center operations data associated with the physical security of a partition and a current operational state. For example, DCICS 105 can collect data about physical barriers (such as which doors are opened/closed or locked/unlocked), IT hardware cabinets (such as which cabinets or panels are opened/closed or locked/unlocked), and the presence of individuals in the partition (e.g., by use of facial recognition, biometrics, card reader, etc.). DCICS 105 can also identify access rights data for recognized individuals. DCICS 105 can determine that the person attempting to access a partition has been assigned access rights to the partition and should be allowed physical access. DCICS 105 may alter the operational state of the partition by unlocking a door and/or cabinet. In various embodiments, DCICS 105 can determine that the person attempting to access the partition has not been assigned access rights to the partition and should not be allowed physical access.

Based on the data center operations data, DCICS 105 can cause one or more changes, such as: grant/restrict access to perimeter gates, entrance doors, gates, service corridors, service galleries, rooms, cages; lock doors, service hatches, racks housing IT hardware; lock various service equipment including power distribution units, controllers, air handling units; trigger alerts to administrators; and log equipment accessed and activity inside the partition.

In various embodiments, the technology can monitor for a natural disaster (flood, earthquake, fire, etc.) and adjust the operation the data center based on the data collected. In various embodiments, DCICS 105 can monitor for natural disasters that can affect the operation of the data center. For example, using sniffers connected to smoke and/or fire detection sensors, DCICS 105 can detect fires and formulate appropriate response actions, identify an optimal action and utilize control functions to implement the action. In various embodiments, DCICS 105 can detect earthquakes from vibration detectors in the monitored partition, from an external information source, such as U.S. Geological Service (USGS) seismic data, and/or by performing a risk analysis or forecast based detected data, user input, external information, forecast modules and historical data. DCICS 105 can detect moisture or floods using leak sensors in a partition or from an external information source, such as external weather data.

In various embodiments, if a natural disaster is predicted or detected, DCICS 105 can determine the type or category of the disaster (e.g., fire, flood, earthquake, etc.) and determine alternative data center assets (e.g., computing, storage, networking, etc. assets) available to provide services (memory, CPU, storage, network connectivity) to applications running in the partition affected by the natural disaster.

In various embodiments, DCICS 105 can rank the alternative data center assets based on one or more of user, device, application, IT hardware, business rules (e.g. a priority assignment) and/or data center rules any of which may be retrieved from a database, received from a system, derived as part of an analysis, determined based upon a pre-determined assignment, received via user input, etc.

DCICS 105 can present the alternative data center assets to the operator of the partition affected by the natural disaster to facilitate dynamically transferring the applications running in the partition affected by the natural disaster to one or more of the alternative data center assets. In various embodiments, DCICS 105 can cause such a transfer without operator interaction (e.g., systematic, automated transfer to the identified alternative data center asset(s)).

In various embodiments, DCICS 105 can determine potential alternative data center assets based on and/or by determining one or more of the following: risk level (e.g., determine whether the alternative data center asset is not also under an unacceptable risk state (fire, flood, etc.)); whether the alternative data center asset has sufficient power to support the processing/storage/networking, etc. needed; whether the alternative data center asset has sufficient storage capacity to support the processing/storage/networking needed; whether the alternative data center asset has sufficient cooling available to support the processing/storage/networking needed; whether the alternative data center asset has sufficient networking to support the processing/storage/networking needed; whether the alternative data center asset has sufficient power and/or cooling redundancy (e.g., 2N, N+1, N, etc.) to support the processing/storage/networking needed; and whether the alternative data center asset is within an acceptable geographical proximity to the partition affected by the natural disaster. In various embodiments, any of the above can be a binary value (e.g., yes or no). In various embodiments, any of the above can be a range of values.

The technology can monitor logical security (e.g., monitor for network intrusion). In various embodiments, DCICS 105 receives data center operations data relating to intrusions from an intrusion detection system (IDS). The IDS can, for example, use pattern matching on router logs to detect logical intrusions (or logical intrusion attempts). DCICS 105 can determine alternative data center assets (e.g., computing, storage, networking, etc. assets) available (e.g., with current and/or future capacity) to accommodate applications running in the partition affected by the intrusion.

In various embodiments, DCICS 105 can rank the alternative data center assets based on a priority assignment determined by the operator of the partition affected by the logical intrusion. In various embodiments, DCICS 105 can rank the alternative data center assets based on one or more of user, device, application, IT Hardware, business rules and/or data center rules. In various embodiments, DCICS 105 can present the alternative data center assets to the operator of the partition affected by the logical intrusion to facilitate dynamically transferring the applications running in the partition affected by the logical intrusion to one or more of the alternative data center assets. In various embodiments, DCICS 105 can cause the transfer without operator interaction (e.g., by automatically transferring to the highest ranked alternative data center assets).

In various embodiments, DCICS 105 can determine potential alternative data center assets based on one or more of the following: asset utilization, utilization forecasts, physical security, logical security, current latency; utility costs; power capacity or availability, cooling capability, physical space, network providers, network bandwidth, network redundancy, power redundancy, a scope or type of intrusion (inbound, outbound, application based, networked based, etc.), known techniques used to terminate the intrusion, present intrusion evasion techniques including alternative data center assets which may have a lower risk profile.

In various embodiments, DCICS 105 can mitigate the risk of intrusion by, for example, shutting down network connectivity, issuing alarms to partitions affected by the logical intrusion; alerting users of partitions affected by the logical intrusion; etc.

The technology can monitor latency (e.g., the network latency encountered by applications running on IT equipment in the data center). In various embodiments, DCICS 105 can receive data center operations data relating to latency from network monitors. DCICS 105 can determine alternative data center assets (e.g., computing, storage, networking, etc. assets) available (e.g., with capacity) to accommodate applications running in the partition affected by high latency. In various embodiments, DCICS 105 can rank the alternative data center assets based on a priority assignment determined by the operator of the partition affected by the high latency. In various embodiments, DCICS 105 can rank the alternative data center assets based on one or more of user, device, application, IT Hardware, business rules and/or data center rules. DCICS 105 can present the alternative data center assets to the operator of the partition affected by the high latency to facilitate dynamically transferring the applications running in the partition affected by the high latency to one or more of the alternative data center assets. In various embodiments, DCICS 105 can cause the transfer without operator interaction (e.g., by automatically transferring to the highest ranked alternative data center assets).

In various embodiments, DCICS 105 can determine potential alternative data center assets based on one or more of the following: asset utilization, utilization forecasts, physical security, logical security, current latency; utility costs; power capacity or availability, power utilization effectiveness, cooling capability, physical space, network providers, network bandwidth, network redundancy and power redundancy.

In determining alternative data center actions in order to optimize a latency optimization dimension, DCICS 105 may obtain information from any layer of the IT stack. The IT stack may include, for example, a user layer, a virtualization layer, an application layer, an operating system layer, an IT or hardware layer and a data center infrastructure layer.

In various embodiments, the technology can monitor redundancy (e.g., the redundancy of AHUs within a data center module). In various embodiments, a data center management system can maintain a level of AHU redundancy (e.g., N, N+1, 2N, 2N+1) in a data center module by selectively enabling AHUs based on current power utilization in the data center module. For example, if each AHU can provide cooling for 35 kW of IT equipment load and the data center module is maintaining 2N AHU redundancy, the data center module can enable 2 AHUs under 50 kW of IT equipment load and 3 AHUs under 80 kW of IT equipment load.

The technology can involve acoustic monitoring. In various embodiments, DCICS 105 can receive acoustic data from acoustic sensors in the data center. In various embodiments, DCICS 105 can compare known "good" acoustic profiles to the received acoustic data, and identify data center equipment as possibly failing or failed if its acoustic profile differs from the known "good" acoustic profiles. In various embodiments, DCICS 105 can compare known "bad" acoustic profiles to the received acoustic data, and identify data center equipment as possibly failing or failed if its acoustic profile matches the known "bad" acoustic profiles.

In various embodiments, DCICS 105 includes a manufacturing resource planning (MRP) tool for identifying, extracting and analyzing data center operational, business and financial data in order to plan future data center operations. Thus, DCICS 105 provides data center planners and operators a real-time tool which enables them to increase capacity and/or capability in a just-in-time manner.

DCICS 105's MRP tool may generate data useful in such planning efforts. For instance: DCICS 105 may set flags indicating when to add cooling capacity at an individual data center asset (e.g. data module) level. In various embodiments, such a cooling capacity flag may be set based upon, for example, an air handling unit capacity reaches some capacity of a running average of the overall power consumption within the data center. As disclosed previously, an expression may be used to define data collection and operations to support such an analysis. In various embodiments. DCICS 105 may track available power at various points in a data center. Such tracking may include granular data collection such as collecting data regarding power pulled from a substation to individual branch circuits within a data center power distribution infrastructure. Such data will allow DCICS 105 to produce recommendations for increasing a data center infrastructure capacity; e.g. order more data modules, power modules, UPSs, PDUs, etc.

The technology can monitor efficiency (e.g., the power usage effectiveness for a partition). In various embodiments, DCICS 105 can receive data center operations data relating to power consumption. DCICS 105 can determine alternative data center assets (e.g., computing, storage, networking, etc. assets) available (e.g., with capacity and appropriate capability) to takeover any applications running in the partition and with lower power usage effectiveness (e.g., as calculated below).

In various embodiments, a power usage effectiveness (PUE) can be calculated. PUE can be a measure of how efficiently a data center operates. PUE can be defined as the ratio of total power consumed (e.g., total power consumed by a data center) to the total power made available to specified IT equipment for productive use (e.g., the total power made available to servers for operating and running applications). The technology facilitates determining PUE for a data center as a whole and/or for partitions within the data center. For example, PUE can be determined for one or more data modules, one or more racks of servers within one or more data modules, or an individual server within a data module. More generally, PUE can be determined for any partition within the data center.

Figure 8:
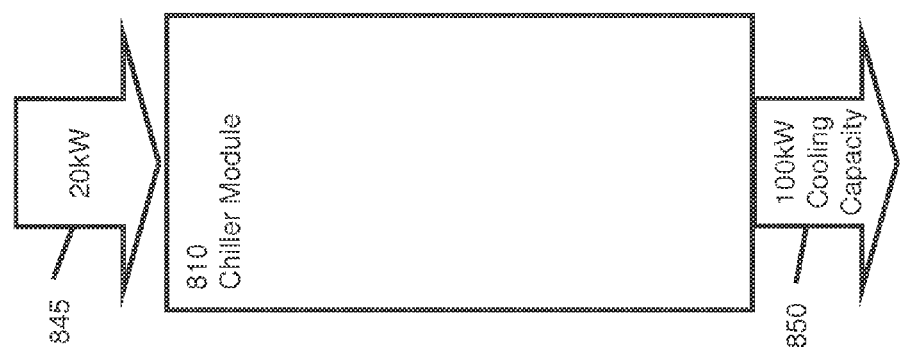
FIG. 8 depicts a modular data center, in accordance with various embodiments.
Figure 8:
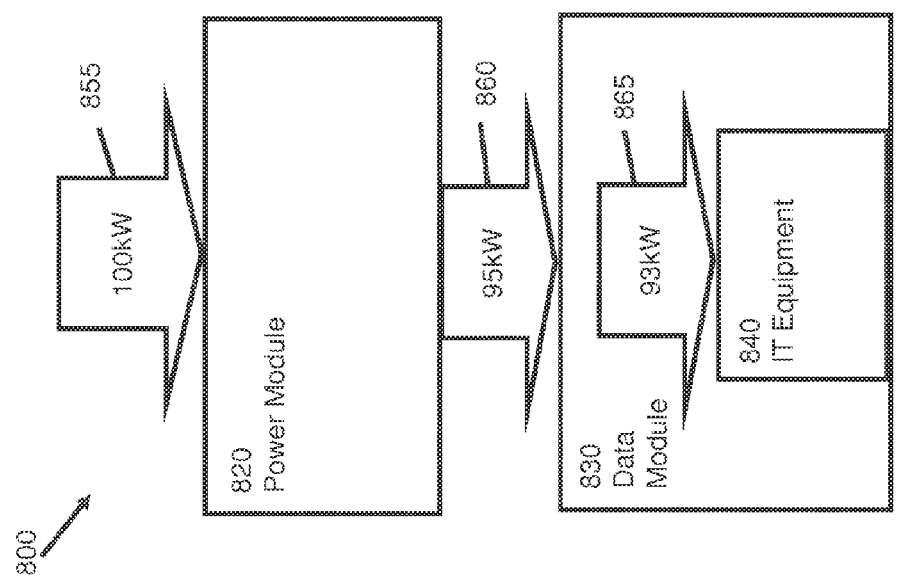

As described above, DCICS 105 can collect data center operations data, including data related to power generation and power consumption by the various components of the data centers that it monitors. FIG. 8 depicts modular data center 800. Modular data center 800 includes chiller module 810, power module 820, and data module 830. Data module 830 can contain IT equipment 840. When data center 800 is in operation, chiller module 810 can provide chilled fluid to power module 820 and data module 830, facilitating cooling of the equipment contained therein (e.g., AHUs within power module 820 and data module 830 can utilize the chilled fluid to provide cooling as described above). Power module 820 can receive power from a power source (e.g., electric utility, generator, etc.). Power module 820 can distribute power to data module 830. Data module 830 can provide power to IT equipment 840 for productive use.

In various embodiments, DCICS 105 can monitor chiller module input 845 (e.g., kW received by chiller module 810 from an electric utility) and chiller module output 850 (e.g., cooling capacity of the chilled fluid provided by chiller module 810). DCICS 105 can monitor power module input 855 (e.g., kW received by power module 820 from an electric utility). DCICS 105 can monitor power module output 860 (e.g., kW received by data module 830 from power module 820). DCICS 105 can monitor Delivered IT Power 865 (e.g., kW delivered to the IT equipment 840 for productive use).

DCICS 105 can calculate PUE for any data center asset that receives power for productive use (e.g., IT Equipment 840), based on the Delivered IT Power to that IT equipment. In various embodiments, Eq. 1 can be used to calculate PUE for the specified IT equipment:

$$PUE = \frac{(PMB*DMB*CMB)*DITP + (((PMB*DMB)-1)*DITP)+DITP}{DITP} \qquad \text{Eq. 1}$$

Where:
CMB is the Chiller Module Burden, provided by the equation:

Chiller Module Input (kw)/Chiller Module Output (kw)

DMB is the Data Module Burden, provided by the equation:

Data Module Input (kw)/Data Module Output (kw)

PMB is the Power Module Burden, provided by the equation:

Power Module Input (kw)/Power Module Output (kw)

DITP is the Delivered IT Power (e.g., the power delivered to the specified IT equipment that receives the DITP for productive use).

Referring to the example illustrated in FIG. 8,

CMB=chiller module input 845/chiller module output 850=20 kW/100 kW=0.2

PMB=power module input 855/power module output 860=1.05

DMB=power module output 860 (e.g., data module input)/Delivered IT Power 865 (e.g., data module output)=1.02

DITP=Delivered IT Power 865=93 kW

Evaluating Eq. 1 with the values in the example above results in a PUE calculation of 1.29 (rounded to the nearest tenth). It should be appreciated that PUE can be calculated for any IT equipment (e.g., partitions including one or more servers) based on the Delivered IT Power provided to the IT equipment.

The above-described techniques can be implemented in digital electronic circuitry, or in computer hardware, firmware, software, or in combinations of them. The implementation can be as a computer program product, i.e., a computer program tangibly embodied in an information carrier, e.g., in a machine-readable storage device, for execution by, or to control the operation of, data processing apparatus, e.g., a programmable processor, a computer, or multiple computers. A computer program can be written in any form of programming language, including compiled or interpreted languages, and it can be deployed in any form, including as a stand-alone program, application or engine, or as a module, component, subroutine, or other unit suitable for use in a computing environment. A computer program can be deployed to be executed on one computer or on multiple computers at one site or distributed across multiple sites and interconnected by a communication network. Computer programs are configured to enable online and automated functions such as, for example, sending and receiving messages, receiving query requests, configuring responses, dynamically configuring user interfaces, requesting data, sending control instructions, receiving data, parsing data, displaying data, executing complex processes, interpreting scripts, constructing database queries, executing data base queries, executing simulations, calculations, forecasts, mathematical techniques, workflows and/or algorithms, prompting users, verifying user responses, initiating processes, initiating other computer programs, triggering downstream systems and processes, encrypting and decrypting.

Computer programs and other software elements may be loaded onto a general purpose computer, special purpose computer, or other programmable data processing apparatus to produce a machine, such that the instructions that execute on the computer or other programmable data processing means for implementing the functions specified in the flowchart block or blocks. These computer program instructions may also be stored in a computer-readable memory that can direct a computer or other programmable data processing apparatus to function in a particular manner, such that the instructions stored in the computer-readable memory produce an article of manufacture including instruction means which implement the function specified herein or in flowchart block or blocks. The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions specified in the flowchart block or blocks.

Functional blocks of the block diagrams and flowchart illustrations support combinations of means for performing the specified functions, combinations of steps for performing the specified functions, and program instruction means for performing the specified functions. It will also be understood that each functional block of the block diagrams and flowchart illustrations, and combinations of functional blocks in the block diagrams and flowchart illustrations, can be implemented by either special purpose hardware-based computer systems which perform the specified functions or steps, or suitable combinations of special purpose hardware and computer instructions. Further, illustrations of the process flows and the descriptions thereof may make reference to user windows, web pages, web sites, web forms, prompts, etc. Practitioners will appreciate that the illustrated steps described herein may comprise in any number of configurations including the use of windows, web pages, web forms, popup windows, prompts and/or the like. It should be further appreciated that the multiple steps as illustrated and described may be combined into single web pages and/or windows but have been expanded for the sake of simplicity. In other cases, steps illustrated and described as single process steps may be separated into multiple web pages and/or windows but have been combined for simplicity.

Method steps can be performed by one or more programmable processors executing a computer program to perform functions of the invention by operating on input data and generating output. Method steps can also be performed by, and apparatus can be implemented as, special purpose logic circuitry, e.g., an FPGA (field programmable gate array) or an ASIC (application-specific integrated circuit). Modules can refer to portions of the computer program and/or the processor/special circuitry that implements that functionality.

Processors suitable for the execution of a computer program include, by way of example, both general and special purpose microprocessors, and any one or more processors of any kind of digital computer. Generally, a processor receives instructions and data from a read-only memory or a random access memory or both. A computer comprises a processor for executing instructions and one or more memory devices for storing instructions and data. Generally, a computer also includes, or can be operatively coupled to receive data from or transfer data to, or both, one or more mass storage devices for storing data, e.g., magnetic, magneto-optical disks, or optical disks. Data transmission and instructions can also occur over a communications network. Information carriers suitable for embodying computer program instructions and data include all forms of non-volatile memory, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in special purpose logic circuitry.

To provide for interaction with a user, the above described techniques can be implemented on a computing device coupled to or communicating with a display device, e.g., a CRT (cathode ray tube) or LCD (liquid crystal display) monitor, for displaying information to the user and a keyboard and a pointing device, e.g., a mouse or a trackball, by which the user can provide input to the computer (e.g., interact with a user interface element). Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input.

The above described techniques can be implemented in a distributed computing system that includes a back-end component, e.g., as a data server, and/or a middleware component, e.g., an application server, and/or a front-end component, e.g., a client computer having a graphical user interface and/or a Web browser through which a user can interact with an example implementation, or any combination of such back-end, middleware, or front-end components. The components of the system can be interconnected by any form or medium of digital data communication, e.g., a communication network. Examples of communication networks include a local area network ("LAN") and a wide area network ("WAN"), e.g., the Internet, and include both wired and wireless networks.

The computing system can include clients and servers. A client and server are generally remote from each other and typically interact through a communication network. The relationship of client and server arises by virtue of computer programs running on the respective computers and having a client-server relationship to each other.

Any of the communications, inputs, storage, databases or displays discussed herein may be facilitated through a web site having web pages. The term "web page" as it is used herein is not meant to limit the type of documents and applications that may be used to interact with the user. For example, a typical web site may include, in addition to standard HTML documents, various forms, Java applets, JavaScript, active server pages (ASP), common gateway interface scripts (CGI), Flash files or modules, FLEX, ActionScript, extensible markup language (XML), dynamic HTML, cascading style sheets (CSS), helper applications, plug-ins, and/or the like. A web site, server or computer program may include a web service which includes applications that are capable of interacting with other applications over a communications means, such as the Internet.

Benefits, other advantages, and solutions to problems have been described herein with regard to specific embodiments. However, the benefits, advantages, solutions to problems, and any element(s) that may cause any benefit, advantage, or solution to occur or become more pronounced are not to be construed as critical, required, or essential features or elements of any or all of the claims of the invention.

Systems, methods and computer program products are provided. In the detailed description herein, references to "various embodiments", "one embodiment", "an embodiment", "an example embodiment", "some embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. After reading the description, it will be apparent to one skilled in the relevant art(s) how to implement the disclosure in alternative embodiments.

It should be understood that the detailed description and specific examples, indicating embodiments of the invention, are given for purposes of illustration only and not as limitations. Many changes and modifications within the scope of the invention may be made without departing from the spirit thereof, and the invention includes all such modifications. Corresponding structures, materials, acts, and equivalents of all elements are intended to include any structure, material, or acts for performing the functions in combination with other elements. Reference to an element in the singular is not intended to mean "one and only one" unless explicitly so stated, but rather "one or more." Moreover, when a phrase similar to "one of A, B, or C" or "one of A, B, and C" is used in the claims or the specification, the phrase is intended to mean any of the following: (1) at least one of A; (2) at least one of B; (3) at least one of C; (4) at least one of A and at least one of B; (5) at least one of B and at least one of C; (6) at least one of A and at least one of C; or (7) at least one of A, at least one of B, and at least one of C.

What is claimed is:

1. A data center control and optimization system, comprising:
    a memory, the memory in communication with a processor, the processor when executing a computer program for data center control and optimization, performs operations comprising:
    accessing, by the processor, input data associated with data center operations, wherein the input data comprises inventory data, operational data, historical data and external data;
    identifying and analyzing the input data based on a plurality of optimization dimensions, the plurality of optimization dimensions including at least a redundancy optimization dimension and a latency optimization dimension;
    selecting, by the processor, at least one data center optimization dimension from the plurality of optimization dimensions, the selected at least one data center optimization dimension including at least the redundancy optimization dimension,
    forecasting, by the processor and based upon at least a portion of the input data, to produce predictive data associated with the selected redundancy optimization dimension;
    identifying a plurality of optimization actions based on the input data and the predictive data associated with the selected redundancy optimization dimension;
    determining, for each optimization action, a respective optimization score based upon the selected redundancy optimization dimension;
    selecting, by the processor without operator interaction and based upon the selected redundancy optimization dimension, the predictive data, the input data, and the optimization scores, the optimization action; and
    generating, by the processor without operator interaction, an optimization instruction based upon the selected redundancy optimization action and executing the optimization instruction to modify at least one asset of the data center.

2. The system of claim 1, wherein the plurality of optimization dimensions further comprises at least one of reliability, resiliency, risk, efficiency, cost and threat avoidance.

3. The system of claim 1, wherein the identifying comprises at least one of receiving input, obtaining from a data source, calculating and forecasting, and wherein the data source comprises at least one of a historical database, a customer relationship management database, a data warehouse, a product catalog, an accounting system, the internet, a government data source, a vendor database, a utility system, a power system, a security system, a network provider system and data collection points associated with the data center operations.

4. The system of claim 3, wherein at least a subset of the data collection points comprises at least one of a sensor, a detector, information technology (IT) equipment, an IT equipment interface, a data translator, a virtualization system interface, an application programming interface, and external system data.

5. The method of claim 4, wherein the sensor comprises at least one of a temperature sensor, a humidity sensor, a fire detector, a smoke detector, a high sensitivity smoke detector, a very early smoke detection apparatus, a moisture detector, a spot leak detector, a pressure sensor, an intrusion detector, a motion detector, a biometric sensor, an acoustic sensor, a valve position indicator, a power monitor, a fan speed and a fan direction.

6. The system of claim 1, further comprising analyzing a plurality of the data center assets based upon the selected optimization dimension.

7. The system of claim 6, further comprising analyzing the plurality of data center assets based upon at least one attribute of each data center asset, wherein the attribute comprises at least one of risk state, power capability, power usage effectiveness, physical space, cooling capability, networking capability, redundancy capability, and geographic proximity.

8. The system of claim 1, wherein the analyzing the input data comprises analyzing the input data to identify at least one of customer data, configuration data, product data, sales data, cost data, revenue data, and revenue by product data.

9. The system of claim 1, wherein the determining the optimization action comprises at least one of performing a proprietary algorithm, performing a simulation, performing artificial intelligence, performing a stochastic method and executing a linear programming model.

10. The system of claim 1, further comprising: in response to the optimization instruction being executed, receiving updated operational data from data collection points associated with the data center operations; and updating a historical database with the updated operational data.

11. The system of claim 1, further comprising:
detecting physical security information comprising at least one of biometric data, card swipe data and intrusion detection data, wherein the input data comprises the physical security information;
forecasting the predictive data by determining a physical security risk profile of an individual, wherein the individual is identified by the physical security information;
determining, based upon at least one of the physical security information and the physical security risk profile, the selected optimization dimension.

12. The system of claim 11, further comprising determining the at least one data center optimization action to additionally be threat avoidance, wherein the optimization instruction causes a door to be locked, wherein the door enables access to at least one of a data center, a data center module, a cabinet, a control panel and a sub-floor space.

13. The system of claim 1, further comprising determining the optimization action to include moving an application to a second location, wherein the optimization instruction causes the application to move from a first server in a first location to a second server in the second location.

14. The system of claim 13, further comprising determining the at least one data center optimization dimension to additionally be at least one of risk and reliability, wherein the optimization action is based upon the optimization dimension and at least one attribute associated with the second location, wherein the at least one attribute comprises at least one of risk state, power capability, physical space, cooling capability, networking capability, redundancy, and geographic proximity.

15. The system of claim 14, wherein the forecasting the predictive data comprises analyzing data collection point information, historical data and external data to predict the likelihood of at least one of a flood, a hurricane and an earthquake.

16. The system of claim 14, wherein the forecasting the predictive data comprises analyzing at least one of data collection point information, historical information, and external data to predict a network latency level.

17. The system of claim 14, wherein the forecasting the predictive data comprises analyzing at least one of data collection point information, historical information, and external data to create a power utilization prediction schedule for a plurality of data center assets associated with the data center operation, wherein the external data comprises at least one of power usage effectiveness data, utility usage information and utility cost information.

18. The system of claim 17, wherein the optimization instruction comprises a load balancing plan that at least one of minimizes energy consumption, minimizes energy costs and minimizes power utilization effectiveness ratio.

19. The system of claim 18, further comprising communicating the load balancing plan to a user via at least one of a graphical user interface and a notification message.

20. The system of claim 1, wherein the selecting the at least one data center optimization dimension further includes selecting the latency optimization dimension as the selected at least one optimization dimension,
wherein the accessing the input data includes accessing data center operations latency data from network monitors,
wherein the identifying the plurality of optimization actions includes ranking alternative data center assets based on a priority assignment,
wherein the selecting the optimization action includes selecting at least one of the alternative data center assets based on the ranking, and
wherein the generating and the executing of the optimization instruction includes dynamically transferring applications subject to latency to the selected at least one of the alternative data center assets.

21. The system of claim 1, wherein the plurality of optimization dimensions further includes an efficiency dimension, and wherein the selecting the at least one data center optimization dimension further includes selecting the efficiency dimension, wherein the accessing the input data includes accessing data center operations power consumption data, wherein the identifying the plurality of optimization actions includes evaluating alternative data center assets based on a power usage effectiveness for each of the alternative data center assets, wherein the selecting the optimization action includes selecting at least one of the alternative data center assets based on the evaluation, and wherein the generating and the executing of the optimization instruction includes dynamically transferring applications to the selected at least one of the alternative data center assets.

22. The system of claim 1, wherein the accessing the input data includes accessing data center operations data for alternative data center assets, the data center operations data includes a redundancy rating for power and cooling capabilities for each of the alternative data center assets, wherein the identifying the plurality of optimization actions includes evaluating the alternative data center assets based on the redundancy ratings;

wherein the selecting the optimization action includes selecting at least one of the alternative data center assets based on the evaluation, and wherein the generating and the executing of the optimization instruction includes dynamically transferring applications to the selected at least one of the alternative data center assets.

23. A computerized method for controlling and optimizing data center operations, comprising:

accessing, by a data center infrastructure control system ("DCICS"), input data associated with data center operations, wherein the input data comprises inventory data, operational data, historical data and external data;

determining, by the DCICS, at least one data center optimization dimension, wherein the determining includes selecting the at least one data center optimization dimension from a plurality of data center optimization dimensions that include at least a redundancy optimization dimension and a latency optimization dimension, the selected at least one data center optimization dimension including at least the redundancy optimization dimension;

forecasting, by the DCICS and based upon at least a portion of the input data, to produce predictive data;

identifying a plurality of optimization actions based on the input data and the predictive data;

determining, for each optimization action, a respective optimization score based upon the selected redundancy optimization dimension;

selecting, by the DCICS and based upon the selected redundancy optimization dimension, the predictive data, the input data, and the optimization scores, the optimization action;

generating, by the DCICS without operator interaction, an optimization instruction based upon the selected optimization action, wherein executing the optimization instruction causes to modify at least one asset of the data center as a change in an operational state; and accessing additional input data to verify the change in the operational state.

* * * * *